United States Patent
Mita et al.

(10) Patent No.: US 8,202,794 B2
(45) Date of Patent: Jun. 19, 2012

(54) METHOD OF MANUFACTURING FIELD EFFECT TRANSISTOR HAVING OHMIC ELECTRODE IN A RECESS

(75) Inventors: Juro Mita, Tokyo (JP); Katsuaki Kaifu, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 13/064,637

(22) Filed: Apr. 5, 2011

(65) Prior Publication Data

US 2011/0189826 A1 Aug. 4, 2011

Related U.S. Application Data

(62) Division of application No. 11/505,301, filed on Aug. 17, 2006, now Pat. No. 7,923,753.

(30) Foreign Application Priority Data

Aug. 17, 2005 (JP) ................................. 2005-236389

(51) Int. Cl.
- H01L 21/28 (2006.01)
- H01L 21/3205 (2006.01)
- H01L 21/44 (2006.01)
- H01L 29/06 (2006.01)
- H01L 31/00 (2006.01)
- H01L 29/66 (2006.01)

(52) U.S. Cl. ........ 438/604; 438/571; 438/576; 438/602; 257/24; 257/191; 257/192; 257/194

(58) Field of Classification Search .................. 438/571, 438/604

See application file for complete search history.

(56) References Cited

U.S. PATENT DOCUMENTS

| 5,198,879 | A | 3/1993 | Ohshima |
| 5,254,863 | A | 10/1993 | Battersby |
| 6,465,814 | B2 | 10/2002 | Kasahara et al. |
| 6,897,137 | B2 | 5/2005 | Nguyen et al. |
| 2005/0087763 | A1 | 4/2005 | Kanda et al. |
| 2005/0139838 | A1 | 6/2005 | Murata et al. |
| 2008/0173898 | A1 | 7/2008 | Ohmaki |

OTHER PUBLICATIONS

"Recessed Ohmic AlGaN/AlN/GaN HEMTs Grown on 100-mm-diam. Epitaxial AlN/Sapphire Template", M. Miyoshi et al, Technical Report of IEICE, ED2004-217, NW2004-224 (Jan. 2005), pp. 31-35.

*Primary Examiner* — Nathan Ha
*Assistant Examiner* — Michael Jung
(74) *Attorney, Agent, or Firm* — Rabin & Berdo, P.C.

(57) ABSTRACT

The contact resistance between an Ohmic electrode and an electron transit layer is reduced compared with a case in which the Ohmic electrode is provided to a depth less than the heterointerface. As a result, for an Ohmic electrode provided in a structure comprising an electron transit layer formed of a first semiconductor layer formed on a substrate, an electron supply layer comprising a second semiconductor layer forming a heterojunction with the electron transit layer and having a smaller electron affinity than the first semiconductor layer, and a two-dimensional electron layer induced in the electron transit layer in the vicinity of the heterointerface, the end portion of the Ohmic electrode is positioned in the electron transit layer in penetration into the electron supply layer at a depth equal to or greater than the heterointerface.

8 Claims, 19 Drawing Sheets

METHOD OF MANUFACTURING FIELD EFFECT TRANSISTOR HAVING OHMIC ELECTRODE IN A RECESS

This application is a divisional of application Ser. No. 11/505,301, now a U.S. Pat. No. 7,923,753, which was filed on Aug. 17, 2006, the subject matter of which is incorporated herein by reference. Further, this application is based on, and claims priority to, Japanese patent application No. 2005-0236389, filed on Aug. 17, 2005, the content of which is incorporated herein by reference.

BACKGROUND OF THE INVENTION

1. Field of the Invention

The present invention relates to an Ohmic electrode used in semiconductor devices, a field effect transistor comprising such an Ohmic electrode, a semiconductor device comprising such an Ohmic electrode, a method of manufacturing the Ohmic electrode, and a method of manufacturing the field effect transistor.

2. Description of Related Art

Gallium nitride semiconductors (hereafter called "GaN semiconductors") have a high dielectric breakdown voltage and high saturation electron velocity. HEMTs (high-speed mobility transistors) comprising an AlGaN/GaN heterostructure which utilizes these characteristics are attracting attention as power devices capable of high-frequency operation and high withstand-voltage operation to replace GaAs semiconductor devices, for example as high-frequency and high-power amplifier devices in the base stations of cell phone networks.

In general, in order to obtain large output power from the above-described power devices, (1) a large source-drain current, and (2) a high dielectric strength, are effective.

Below, technology of the related art is explained as relating to HEMTs using GaN semiconductors, focusing in particular on the above-described (1) increases in source-drain current.

One method to increase the current between source and drain is to reduce the contact resistance between source and drain electrode and the electron transit layer, described below.

As this type of technology, a technology of the related art in which a depressed portion, called a recess, is provided by dry etching in a region in which source and drain electrodes are to be formed, and the source and drain electrodes are formed in these recesses, is described in a reference ("Recessed Ohmic AlGaN/AlN/GaN HEMTs Grown on 100-mm-diam. Epitaxial AlN/Sapphire Template", M. MIYOSHI et al, Technical Report of IEICE, ED2004-217, NW2004-224 (2005-01), p. 31-35).

Below, this technology of the related art is explained in greater detail, referring to FIG. 22. FIG. 22 shows a cross-section of a HEMT of the related art, disclosed in this reference.

The HEMT 100 comprises a sapphire substrate 102, buffer layer 104, electron transit layer 106, electron supply layer 108, source and drain electrodes 118 and 120, and gate electrode 114.

The sapphire substrate 102 is approximately 630 μm thick. The buffer layer 104 comprises AlN of thickness approximately 1 μm, and is grown epitaxially on the c-plane of the sapphire substrate 102.

The electron transit layer 106 comprises undoped GaN of thickness approximately 2 μm, and is deposited on the buffer layer 104. In an arbitrary layer structure, "undoped" means "without the intentional introduction of impurities". In the following explanation, when an "undoped" state is indicated, the abbreviation "UID-" (Un-Intentionally Doped) is added to the beginning of the layer structure's name.

The electron supply layer 108 comprises an AlN layer 110 and AlGaN layer 112, which are stacked in this order on the electron transit layer 106. Here, the AlN layer 110 is AlN of thickness approximately 1 nm.

The AlGaN layer 112 comprises first, second, and third AlGaN layers 112a, 112b and 112c, stacked in this order on the AlN layer 110. The first AlGaN layer 112a comprises UID-$Al_{0.26}Ga_{0.74}N$ of thickness approximately 7 nm. The second AlGaN layer 112b comprises n-$Al_{0.26}Ga_{0.74}N$, of conduction type n, formed by Si doping at approximately $5\times10^{18}/cm^3$, and is approximately 15 nm thick. The third AlGaN layer 112c comprises UID-$Al_{0.26}Ga_{0.74}N$ of thickness approximately 3 nm.

On the side of the electron transit layer 106 at the heterointerface 115 between the electron transit layer 106 and the electron supply layer 108, a two-dimensional electron layer 116 is formed. This two-dimensional electron layer 116 extends over a thickness of approximately 10 nm from the heterointerface 115, and is formed by an induced two-dimensional electron gas.

On both sides of the region of formation of this HEMT 100, isolation layers 124, 124 are formed and separated each other. The isolation layer 124 is provided to electrically separate a HEMT 100 from other adjacent elements of a chip, and are formed surrounding the region of formation of the HEMT 100.

The isolation layer 124 is electrically insulating, and extends from the top face 108a of the electron supply layer 108 to a depth exceeding the depth of the two-dimensional electron layer 116. The isolation layer 124 is formed by ion implantation.

Between the two isolation layers 124, 124 are provided source and drain electrodes 118, 120, at an interval from the isolation layers 124, 124. The source and drain electrodes 118, 120 are formed at a distance from each other. Source and drain electrodes 118, 120 are electrodes in Ohmic contact with the electron transit layer 106.

Below, the source and drain electrodes 118 and 120 are together called electrodes 128.

Recesses 126, which are depression formed in advance to a prescribed depth from the top face 108a of the electron supply layer 108 in the regions of formation of electrodes 128, is formed. The electrodes 128 are then formed so as to bury these recesses 126.

Between the source and drain electrodes 118, 120 is provided a gate electrode 114, connected by a Schottky junction to the electron supply layer 108.

FIG. 23 shows the relation between the depth of the recesses 126 (depth of the electrodes 128) and the contact resistance in the technology of the related art. FIG. 23 is a citation of FIG. 6 in the above reference.

In FIG. 23, the horizontal axis indicates the etching time (in minutes) required to form the recess 126, and corresponds to the depth of the recess 126. The vertical axis indicates the contact resistance (Q-mm) between the electron transit layer 106 and the electrode 128. The arrow attached to the horizontal axis denotes the etching time corresponding to the depth of the heterointerface 115.

According to FIG. 23, in the region in which the depth of the electrode 128 is more shallow than the heterointerface 115, the contact resistance decreases with increasing depth.

However, when the depth of the electrode 128 becomes deeper than the heterointerface 115, the contact resistance increases.

From these results, it has been thought by person skilled in the art that, as the electrode 128 becomes deeper than the heterointerface 115, the contact resistance increases.

SUMMARY OF THE INVENTION

The inventors discovered, as a result of repeated diligent researches, that even when an end portion of an Ohmic electrode reaches a position deeper than the heterointerface, the contact resistance between the Ohmic electrode and the electron transit layer is reduced, and so arrived at the concept of the present invention.

Hence a first object of the present invention is to provide an Ohmic electrode, and a method of manufacturing same, such that the value of the contact resistance between the Ohmic electrode and the electron transit layer can be reduced even when the Ohmic electrode is provided at a depth below that of the heterointerface.

A second object of the present invention is to provide a field effect transistor, and a method of manufacturing same, in which, by using Ohmic electrodes of the invention as the source electrode and drain electrode, the source-drain current can be made large.

A third object of the present invention is to provide a semiconductor device incorporating therein an Ohmic electrode according to the present invention.

According to a first aspect of the invention, there is provided an Ohmic electrode which is provided in a structure comprising an electron transit layer, an electron supply layer, and a two-dimensional electron layer. Here, the electron transit layer is formed of a first semiconductor layer formed on the main face side of the substrate. The electron supply layer forms a heterojunction with the electron transit layer at a heterointerface, and comprises a second semiconductor layer, formed on the electron transit layer having an electron affinity smaller than that of the first semiconductor layer. The two-dimensional electron layer comprises a two-dimensional electron gas, induced from the heterointerface and extending into the electron transit layer.

In the above-described structure, one end portion of this Ohmic electrode on the main face side is at a depth equal to or greater than that of the heterointerface, penetrating the electron supply layer from the top face of the electron supply layer, and moreover is positioned at a depth which does not exceed the electron transit layer. In the case of the Ohmic electrode of a first invention, the contact resistance between the Ohmic electrode and the electron transit layer is lower than the value in a case in which one end portion on the main face side is positioned at a depth which is more shallow than the heterointerface from the top face of the electron supply layer.

In implementing the invention, it is preferable that the one end portion of the Ohmic electrode on the main face side be positioned at a depth at which contact is made with the two-dimensional electron layer, and moreover it is preferable that at the depth of the heterointerface, the acute-angle side of the angle made by the tangential plane of the surface of the Ohmic electrode with the plane of extension of the heterointerface be greater than 0°, and less than or equal to 56°.

Further, it is still more preferable that the acute-angle side of the angle made by the tangential plane of the surface of the above-described Ohmic electrode with the plane of extension of the heterointerface be greater than 0°, and less than or equal to 33°.

In implementing the invention, it is preferable that the one end portion of the Ohmic electrode on the main face side have a convex curved surface, directed to the outer side of the Ohmic electrode, and that this curved surface of the Ohmic electrode be in contact with the two-dimensional electron layer.

In implementing the invention, it is preferable that the one end of the Ohmic electrode on the main face side intrudes into the electron transit layer over a length of from 3 to 48 nm.

In implementing the invention, it is preferable that the first semiconductor layer be an undoped GaN layer, and that the second semiconductor layer comprises an undoped AlGaN layer, an AlGaN layer of n conduction type, or, stacked semiconductor layers in which an AlGaN layer of n conduction type is enclosed between first and second undoped AlGaN layers.

In implementing the invention, it is preferable that, in the first semiconductor layer, the region corresponding to the two-dimensional electron layer be a GaN layer of n conduction type, and that the second semiconductor layer be an undoped AlGaN layer, an AlGaN layer of n conduction type, or, stacked semiconductor layers in which an AlGaN layer of n conduction type is enclosed between first and second undoped AlGaN layers.

Further, it is preferable that the Ohmic electrode further comprises an AlN layer, that this AlN layer be formed on the top face of the electron transit layer, and that the electron supply layer be formed on the AlN layer.

According to a second aspect of the invention, there is provided a field effect transistor comprising, as either the source electrode or the drain electrode, or as both, any one of the Ohmic electrodes described above.

In the field effect transistor, it is preferable that the gate electrode be provided in a recess formed in the second semiconductor layer.

According to a third aspect of the invention, there is provided a semiconductor device comprising any of the above-described Ohmic electrodes.

According to a fourth aspect of the invention, there is provided a method of manufacturing an Ohmic electrode of the invention, comprising a step in which, in the structure, the region in which the Ohmic electrode is to be formed is etched from the electron supply layer side to a depth equal to or greater than that of the heterointerface, and not exceeding the electron transit layer, to form a recess; a step of burying the recess with a metal material; and a step of heat-treating the metal material buried in the recess.

Further, according to a fifth aspect of the invention, there is provided a method of manufacturing a field effect transistor of the invention, comprising a step of demarcating a region for device formation, by forming a device separation insulating layer which insulates regions on the side on which Ohmic electrodes of the structure are formed; a step of etching either one or both of the regions for formation of the source and drain electrodes in the region for device formation, from the electron supply layer side, to a depth equal to or greater than the heterointerface which does not exceed the electron transit layer, to form recesses; a step of burying metal material in the recesses; and, a step of performing heat treatment of metal material burying the recesses, to form Ohmic electrodes.

In implementing above methods of manufacturing a field effect transistor of the invention, it is preferable that in the step to form recesses, etching be performed by means of inductively-coupled plasma reactive ion etching, using as the etching gas $BCl_3$ the pressure of which is in the range 0.333 to 13.332 Pa.

Further, it is more preferable that the pressure of the etching gas ($BCl_3$) during etching be in the range 0.333 to 7.999 Pa. And, it is more preferable still that the pressure be in the range 0.333 to 5.333 Pa.

An Ohmic electrode of the invention is positioned such that the end portion of the Ohmic electrode on the substrate main face side (the lower end) is positioned at a depth equal to or greater than the heterointerface. As a result, the contact resistance between the Ohmic electrode and the electron transit layer can be reduced compared with the case of positioning the Ohmic electrode at a depth less than that of the heterointerface.

In particular, by positioning the Ohmic electrode so as to obliquely traverse the two-dimensional electron layer, the contact resistance between the Ohmic electrode and the electron transit layer can be markedly reduced. This is inferred to occur because of the increased contact area between the Ohmic electrode surface and the two-dimensional electron layer.

Further, an Ohmic electrode of the invention has, on the lower end, a convex curved surface, directed to the outer side of the Ohmic electrode. By this means, the contact resistance between the Ohmic electrode and the electron transit layer is reduced, possibly because the contact area between the Ohmic electrode and the two-dimensional electron layer is increased.

Further, by using an Ohmic electrode of the invention, in a nitride compound semiconductor having AlGaN as the electron supply layer and GaN as the electron transit layer, the contact resistance between the electron transit layer and the Ohmic electrode can be reduced.

Further, in the above-described nitride compound semiconductor, by providing an AlN layer in the electron supply layer, alloy scattering of electrons in the vicinity of the heterointerface is suppressed.

According to a sixth aspect of the invention, there is provided a field effect transistor using an above-described Ohmic electrode as either the source electrode or the drain electrode, or both, so that the contact resistance between the Ohmic electrode and the electron transit layer can be reduced. As a result, the source-drain current and the maximum transconductance of the field effect transistor can be increased.

A semiconductor device of the invention comprises an Ohmic electrode as described above, so that the contact resistance between the electron transit layer and the Ohmic electrode can be reduced compared with the case in which the electrode is positioned at a depth below that of the heterointerface. As a result, various electrical characteristics of the semiconductor device can be improved.

By means of a method of manufacturing an Ohmic electrode of the invention, an above-described Ohmic electrode can be formed in a structure comprising a first semiconductor layer and a second semiconductor layer. By this means, the contact resistance between the electron transit layer and the Ohmic electrode can be reduced compared to a case in which the Ohmic electrode is positioned at a depth less than that of the heterointerface.

Further, in a method of manufacturing an Ohmic electrode of the invention, by maintaining the gas pressure within a prescribed range during etching, the Ohmic electrode is made to obliquely traverse the two-dimensional electron layer. More specifically, an Ohmic electrode can be fabricated with the lower end in the shape of a convex curved surface, directed outward from the Ohmic electrode. By this means, the contact resistance between the Ohmic electrode and the electron transit layer can be markedly reduced.

By means of a method of manufacturing a field effect transistor of the invention, a field effect transistor can be manufactured in which an above-described Ohmic electrode is used as either the source electrode or as the drain electrode, or as both. By this means, the contact resistance between the source electrode or drain electrode and the electron transit layer can be reduced, and as a result, the source-drain current and the maximum transconductance can be increased.

Further, in a method of manufacturing a field effect transistor of the invention, by maintaining the gas pressure within a prescribed range during etching, the contact resistance between the Ohmic electrode and the electron transit layer can be markedly reduced, and as a result, the source-drain current and the maximum transconductance can be increased.

BRIEF DESCRIPTION OF THE DRAWINGS

Other objects and advantages of the invention are explained referring to the following attached drawings.

DESCRIPTION OF THE PREFERRED EMBODIMENTS

Figure 1:
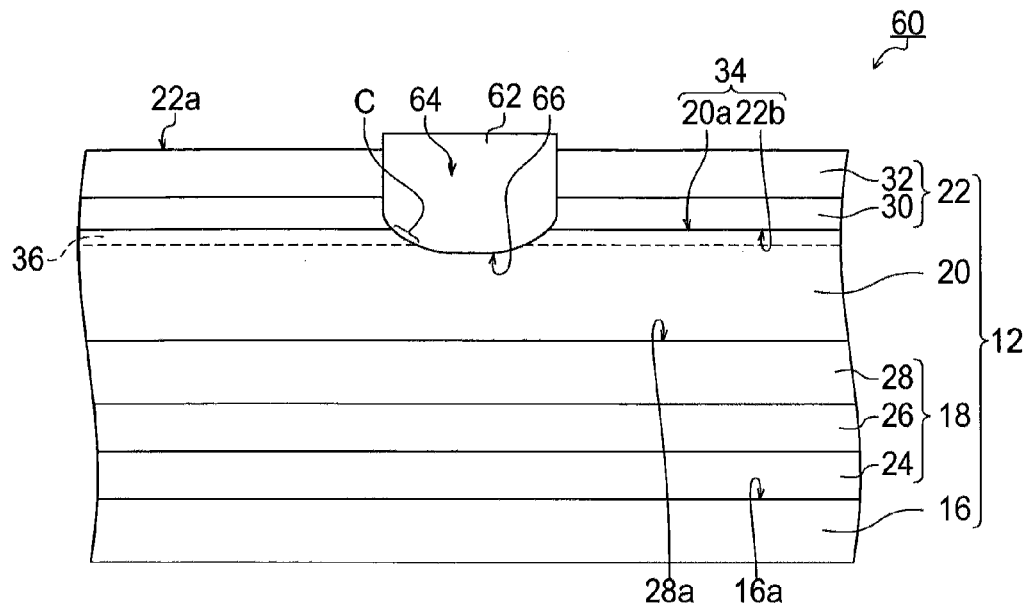
FIG. 1 is an enlarged view showing a cross-section of a structure for reducing contact resistance of a first embodiment of an Ohmic electrode according to the invention.

With reference to the drawings detailed explanations will be hereinafter given to embodiments of the invention. In the drawings, the shapes, sizes, and positional relations of constituent elements will be merely shown in summary fashion to an extent enabling understanding of the invention. Moreover, in the following, appropriate configuration examples of the invention will be explained; but the material properties, numerical conditions and similar of the constituent elements are merely appropriate examples. Hence the invention is in no way limited to the following embodiments.

First Embodiment

An Ohmic electrode of a first embodiment will be explained referring to FIG. 1 through FIG. 12. In the drawings, hatchmarks and similar indicating cross-sections are omitted.

The structure 60 shown in FIG. 1 comprises an epitaxial substrate 12, and an Ohmic electrode 62 formed on the epitaxial substrate 12.

The epitaxial substrate 12 comprises a substrate 16, base layer 18, electron transit layer 20, and electron supply layer 22.

The substrate 16 is a Si single crystal substrate. On the main face 16a of the substrate 16 is formed the base layer 18.

The base layer 18 comprises a first buffer layer 24, a second buffer layer 26, and a superlattice layer 28. These layers 24, 26 and 28 are layered in this order on the main face 16a of the substrate 16.

The first buffer layer 24 comprises AlN, and is grown at a temperature of approximately 1100° C. on the main face 16a of the substrate 16 using a MOCVD (metallorganic chemical vapor deposition) method. It is preferable that the first buffer layer 24 be for example of thickness approximately 8 nm, but the thickness can be set arbitrarily as appropriate, according to the design.

The second buffer layer 26 comprises UID-AlGaN, and is grown on the first buffer layer 24 by a MOCVD method at a temperature of approximately 1070° C. It is preferable that the second buffer layer 26 be for example of thickness approximately 40 nm, but the thickness can be set arbitrarily as appropriate, according to the design.

The superlattice layer 28 has a structure in which a stacked member of 20 nm of UID-GaN and 5 nm of AlN are grown in this order is a single unit structure, and these unit structures are stacked for 20 times. This superlattice layer 28 is grown on the second buffer layer 26 by a well-known MOCVD method.

The electron transit layer 20 comprises UID-GaN as a first semiconductor layer, and is grown using a MOCVD method at a temperature of approximately 1070° C. on the base layer 18, and more specifically, on the top face 28a of the superlattice layer 28. The UID-GaN has a larger electron affinity than the UID-$Al_{0.26}Ga_{0.74}N$ comprised by the electron supply layer 22. Further, it is preferable that the electron transit layer 20 be for example 2 μm thick; but the thickness can be set arbitrarily as appropriate within the range 0.3 to 5 μm, according to the design.

The electron supply layer 22 comprises a spacer layer 30 and AlGaN layer 32. These layers 30 and 32 are stacked in this order on the top face 20a of the electron transit layer 20.

The spacer layer 30 comprises electrically insulating AlN, and is grown on the electron transit layer 20 using a MOCVD method at a temperature of approximately 1070° C. It is preferable that the spacer layer 30 be for example approximately 1 nm thick; but the thickness can be set arbitrarily as appropriate within the range 0.5 to 10 nm, according to the design.

The AlGaN layer 32 comprises UID-$Al_{0.26}Ga_{0.74}N$ as a second semiconductor layer, and is grown on the spacer layer 30 using a MOCVD method at a temperature of approximately 1070° C. The UID-$Al_{0.26}Ga_{0.74}N$ has an electron affinity smaller than that of the UID-GaN forming the electron transit layer 20. It is preferable that the AlGaN layer 32 be for example approximately 18 nm thick; but the thickness can be set arbitrarily as appropriate within the range 5 to 50 nm, according to the design.

Hence the total thickness of the electron supply layer 22 is the sum of the thickness of the spacer layer (approximately 1 nm) and the thickness of the AlGaN layer (approximately 18 nm), that is, approximately 19 nm.

Here, the boundary interface between the electron supply layer 22 and the electron transit layer 20 is a heterointerface 34 which joins different semiconductor layers. The heterointerface 34 comprises the top face 20a of the electron transit layer 20 and the bottom face 22b of the electron supply layer 22.

In the above-described electron transit layer 20, a two-dimensional electron gas (hereafter abbreviated to "2DEG") is induced in the vicinity of the heterointerface 34, that is, in the region extending for a certain range from the heterointerface 34 into the electron transit layer 20. This 2DEG is induced as a result of the difference in electron affinities of the electron supply layer 22 and electron transit layer 20, and due to the difference in lattice constants between the electron supply layer 22 and the electron transit layer 20. This 2DEG is distributed in the electron transit layer 20, for example, to a depth of approximately 10 nm from the heterointerface 34. Hereafter, the region in the electron transit layer 20 in which this 2DEG is distributed shall be called the two-dimensional electron layer 36.

A recess 64 is formed as a depression in this epitaxial substrate 12. The recess 64 is substantially a rectangular shape in plane view (not shown), and has a depth extending from the top face 22a of the electron supply layer 22 past the heterointerface 34 to the two-dimensional electron layer 36.

The Ohmic electrode 62 which makes Ohmic contact with the electron transit layer 20 is positioned so as to bury this recess 64. Hence the Ohmic electrode 62 extends from the top face 22a of the electron supply layer 22 to penetrate the electron supply layer 22, to a depth beyond the heterointerface 34, but not exceeding a bottom face of the electron transit layer 20.

In other words, the distance between one end 66 of the Ohmic electrode 62 opposing the main face 16a of the substrate 16 and the top face 28a is equal to or less than the distance between the heterointerface 34 and the top face 28a of the superlattice layer 28.

Figure 2:
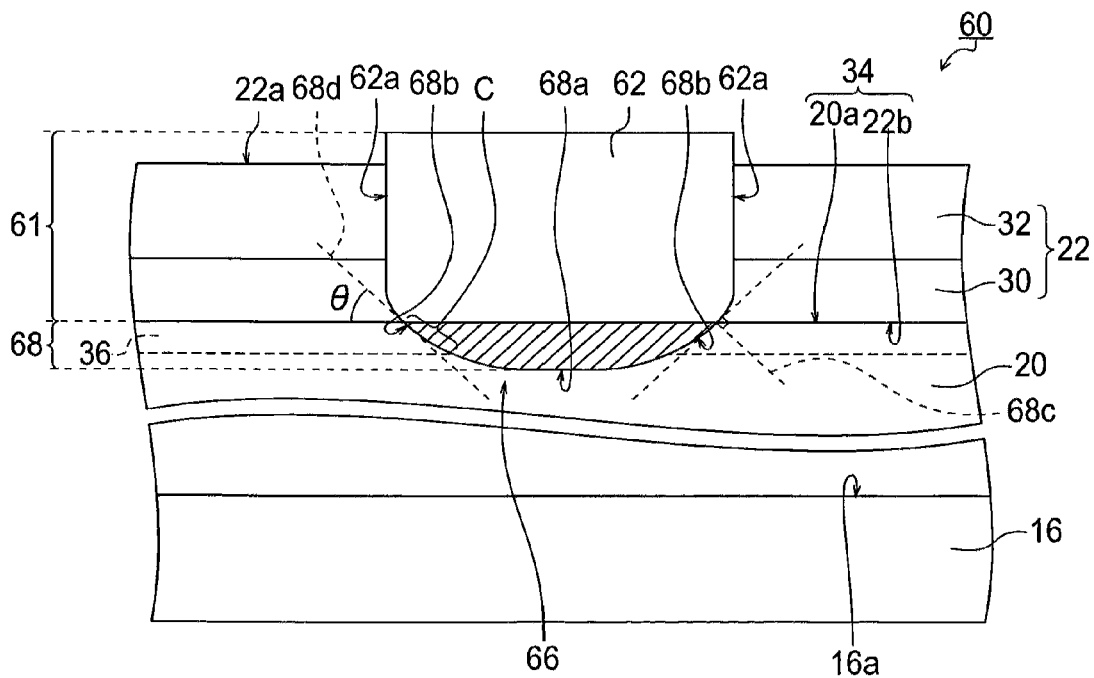
FIG. 2 is a view showing diagrammatically an enlarged cross-section of principal portions, for explaining the positioning of the Ohmic electrode in the vicinity of a two-dimensional electron layer in the first embodiment of the present invention.
Figure 3:
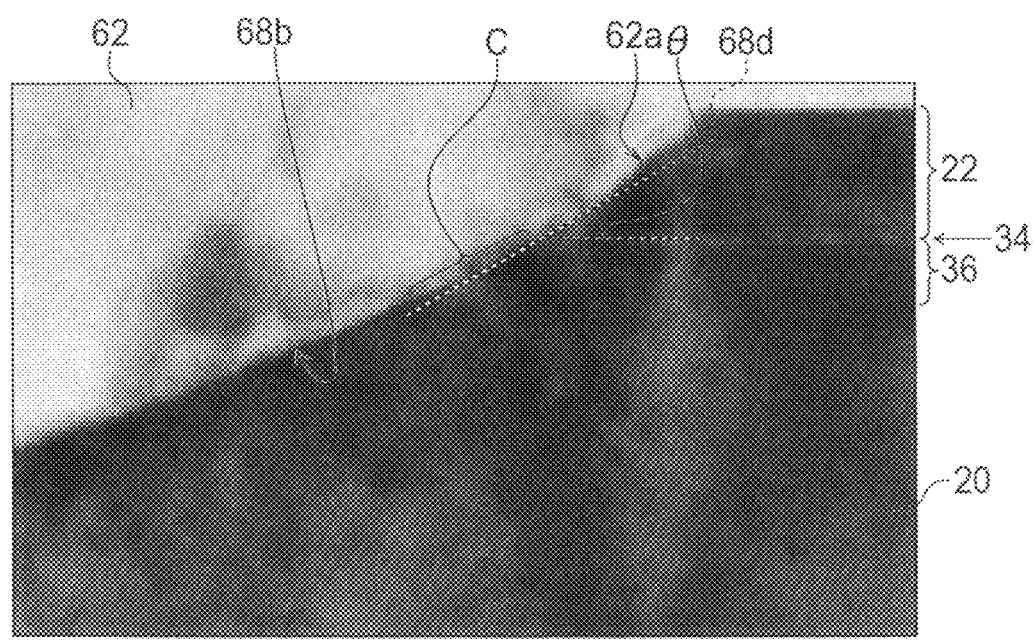
FIG. 3 is a cross-sectional TEM photo of an Ohmic electrode of the first embodiment of the present invention.

Positioning of the Ohmic electrode 62 in the electron transit layer 20 is explained in greater detail, referring to FIG. 1 through FIG. 3.

Referring to FIG. 2, this Ohmic electrode 62 comprises an upper structure 61 with side faces 62a, and a convex portion 68 protruding on the side of the substrate 16.

The upper structure 61 is a portion of the Ohmic electrode 62 depth less than the heterointerface 34. The upper structure 61 is integral with the convex portion 68, and comprises side faces 62a which are continuous with the curved surfaces 68b, described below.

The convex portion 68 represents the portion of the Ohmic electrode 62 which is of depth equal to or greater than the heterointerface 34, that is, the portion extending from the heterointerface 34 to the electron transit layer 20. And more specifically, the convex portion 68 is one end 66 (hereafter also called the lower end 66) of the Ohmic electrode 62. This convex portion 68 has a convex curved shape directed in the outer direction of the Ohmic electrode 62. In FIG. 2, diagonal lines denote this convex portion 68.

Specifically, the convex portion 68 comprises a flat face 68a forming a bottom face, and the curved surfaces 68b. The flat face 68a extends parallel to the main face 16a of the substrate 16. The planar shape of the flat face 68a is of a size smaller than the planar shape of the top face of the Ohmic electrode 68.

The curved surfaces 68b are curved faces connecting the peripheral ends of the flat face 68a with the lower ends of the side faces 62a. The curved surfaces 68b are curved in a convex manner directed outward from the Ohmic electrode 62. In other words, the curved surfaces 68b can have the tangents, at each point on a cross-sectional outline (lines indicating the curved surfaces 68b in FIG. 2), have a slope which increases moving from the flat face 68a toward the side faces 62a.

At the depth of the heterointerface 34, the angle θ on the acute angle side at which the plane 68d tangential to the curved surface 68b intersects the extension of the plane of the heterointerface 34 is, for example, approximately 33°.

The Ohmic electrode 62 makes contact with the two-dimensional electron layer 36 at the curved surface 68b. In the contact region C between the curved surface 68b and the two-dimensional electron layer 36, the normal 68c at each point of the curved surface 68b is inclined with respect to the main face 16a of the substrate 16. That is, the Ohmic electrode 62 is positioned such that the normals 68c to the curved surface 68b obliquely penetrate the two-dimensional electron layer 36.

In the following, the depth of the flat face 68a of the convex portion 68 from the top face 22a of the electron supply layer 22 is simply called the "depth of the Ohmic electrode 62".

FIG. 3 shows a cross-sectional TEM (transmission electron microscope) photo of an Ohmic electrode 62. This photo enlarges a cross-section of an Ohmic electrode 62 by approximately 400,000 times.

The black portion in FIG. 3 corresponds to the electron supply layer 22 and electron transit layer 20. The white portion, which is surrounded by the curved black region, corresponds to the Ohmic electrode 62.

In the photo, the straight white line horizontally traversing the black portion, at a depth of approximately 2 cm from the horizontal plane of the black portion, corresponds to a spacer layer 30. The thickness of the electron supply layer 22 as read from the photo is approximately 19 nm.

Although not appearing in this photo, the two-dimensional electron layer 36 extends within the electron transit layer 20 from the heterointerface 34 over a range of approximately 10 nm.

In this Ohmic electrode 62, the side faces 62a are not clearly distinguished from the curved surface 68b, and the curved surface 68b has a shape in which the curvature is maintained during extension to the top face 22a of the electron supply layer 22.

As explained above, the curved surface 68b of the Ohmic electrode 62 is positioned so as to be inclined with respect to the two-dimensional electron layer 36 in the region C of contact with the two-dimensional electron layer 36. From FIG. 3, at points of intersection of the curved surface 68b with the heterointerface 34, the angle θ (on the acute angle side) made by the tangent to the curved surface 68b with the heterointerface 34 is approximately 33°.

Next, a method of manufacturing a structure 60 comprising an epitaxial substrate 12 and Ohmic electrode 62 is explained, referring to FIG. 4 and FIG. 5.

Processes to manufacture this structure 60 broadly comprise (A) processes to manufacture the epitaxial substrate 12, and (B) processes to manufacture the Ohmic electrode 62.

Below, details of the manufacturing processes are explained.

Figure 4A:
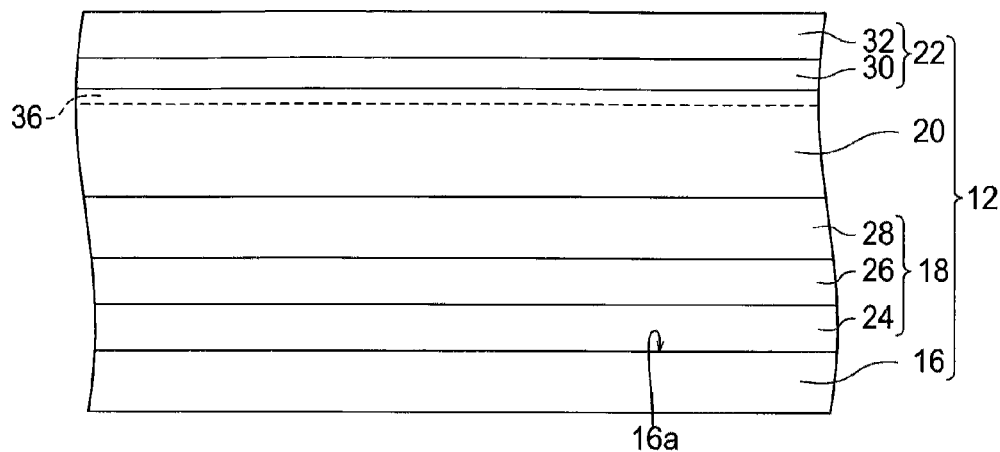
FIG. 4A is a process diagram for explaining a method of manufacturing a structure to reduce contact resistance of the first embodiment of the present invention.

(A) Processes to Manufacture an Epitaxial Substrate 12 (FIG. 4A)

(A1) First, a substrate 16, comprising single-crystal Si of thickness approximately 600 μm, is prepared.

(A2) At a temperature of approximately 1100° C., a first buffer layer 24 of AlN is grown on the main face 16a by the MOCVD method to a thickness of approximately 8 nm.

(A3) At a temperature of approximately 1070° C., a second buffer layer 26 of UID-AlGaN is grown on the first buffer layer 24 by the MOCVD method to a thickness of approximately 40 nm.

(A4) At a temperature of approximately 1070° C., a superlattice layer 28 is grown by the MOCVD method on the second buffer layer 26 to a thickness of 20 unit structures, in which a stacked member of 20 nm of UID-GaN and 5 nm of AlN is grown, in this order, as one unit structure. The total thickness of the superlattice layer 28 grown in this way is approximately 500 nm.

By means of the processes (A1) through (A4), the base layer 18 is formed on the main face 16a of the substrate 16.

(A5) At a temperature of approximately 1070° C., an electron transit layer 20 of UID-GaN is grown on the superlattice layer 28 by the MOCVD method to a thickness of approximately 2 μm.

(A6) At a temperature of approximately 1070° C., a spacer layer 30 of AlN is grown on the electron transit layer 20 by the MOCVD method to a thickness of approximately 1 nm.

(A7) At a temperature of approximately 1070° C., an AlGaN layer 32 of UID-$Al_{0.26}Ga_{0.74}N$ is grown on the spacer layer 30 by the MOCVD method to a thickness of approximately 18 nm.

By means of the processes (A6) and (A7), an electron supply layer 22, comprising a spacer layer 30 and an AlGaN layer 32, is formed on the electron transit layer 20.

In this way, the epitaxial substrate 12 shown in FIG. 4A is obtained.

(B) Processes to Manufacture an Ohmic Electrode 62

Figure 4B:
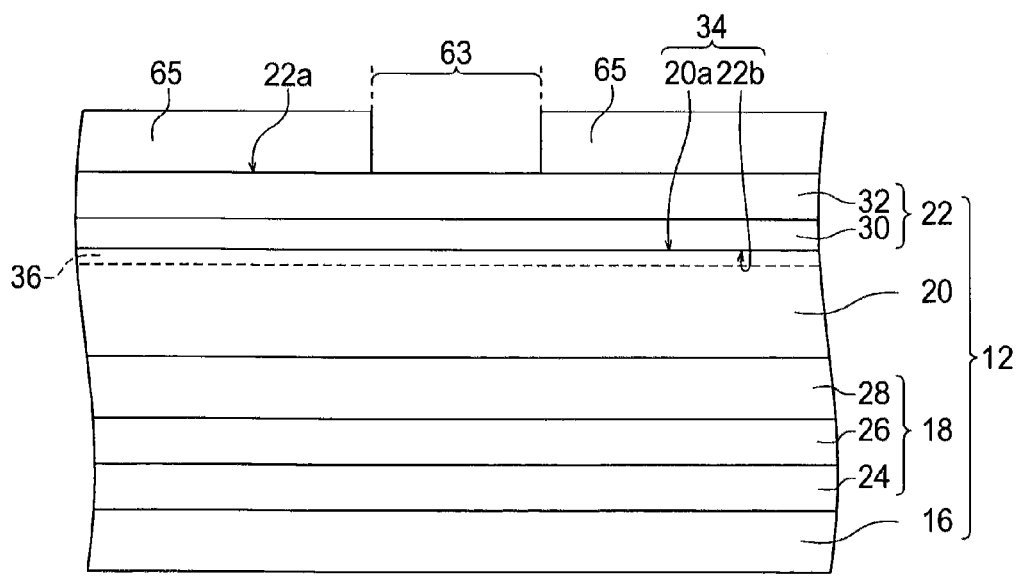
FIG. 4B is a process diagram following that of FIG. 4A.

(B1) First, the structure shown in FIG. 4B is obtained. That is, photolithography techniques are used to cover the top face 22a of the electron supply layer 22 other than the region for formation of the Ohmic electrode 63 with photoresist 65 as an etching protective film.

Figure 5A:
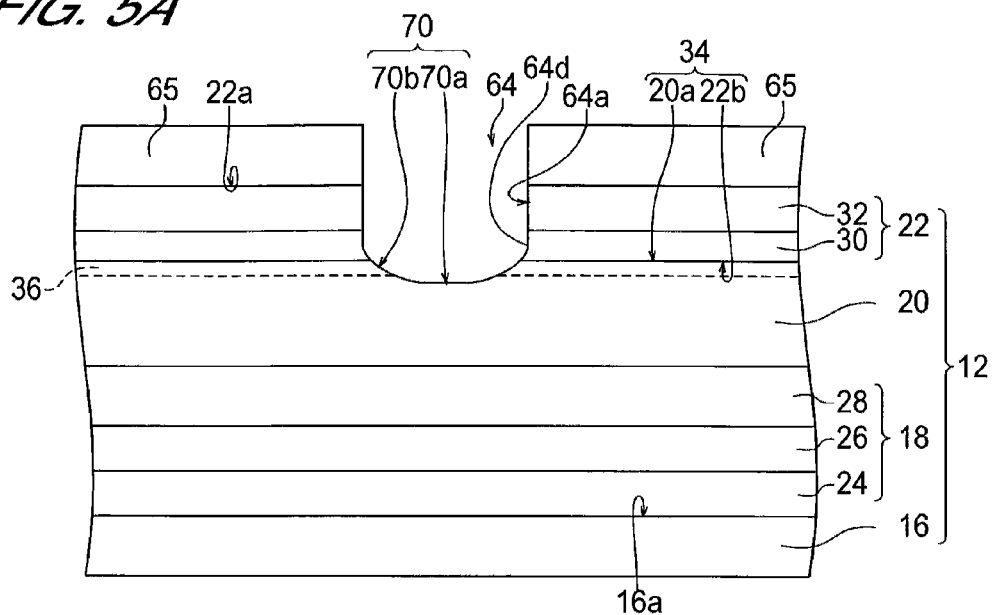
FIG. 5A is a process diagram following that of FIG. 4B.

(B2) Then, the structure shown in FIG. 5A is obtained. That is, the region for formation of the Ohmic electrode 63 is dry-etched from the side of the electron supply layer 22 to a depth equal to or greater than that of the heterointerface 34. In this way, a recess 64 is formed to a depth equal to or greater than that of the heterointerface 34 and intruding into the electron transit layer 20.

The recess 64 is a void, surrounded by side faces 64a, 64a and a bottom face 70. The side faces 64a form the side walls of the depression. The bottom face 70 connects the lower ends 64d of the side faces 64a.

The bottom face 70 is of depth equal to or greater than that of the heterointerface 34, and is curved in a convex fashion directed outward from the recess 64. Specifically, the bottom face 70 comprises a flat face 70a parallel to the main face 16a of the substrate 16, and curved surfaces 70b, 70b connecting the flat face 70a with the lower ends 64d of the side faces 64a. The curved surfaces 70b are formed as curves the curvature of which changes gradually, so that the depth becomes more shallow in moving from the flat face 70a toward the side faces 64a.

Here, the flat face 70a of the bottom face 70 is at a depth of approximately 67 nm from the top face 22a of the electron supply layer 22. That is, the recess 64 is formed to a depth so as to penetrate the electron supply layer 22 and heterointerface 34 and intrude into the electron transit layer 20. As a result, the curved surfaces 70b of the recess 64 make contact with the two-dimensional electron layer 36. Below, the depth of the flat face 70a of the bottom face 70 from the top face 22a of the electron supply layer 22 is simply called the "depth of the recess 64".

In dry etching, an inductively-coupled plasma reactive ion etching method (also called an "ICP-RIE method") was used.

Here the etching gas is, for example, $BCl_3$. The $BCl_3$ flow rate is for example 20 sccm, and the $BCl_3$ gas pressure is for example 5.333 Pa. The ICP output is for example 50W, and the RIE output is for example 30W. Dry etching was performed using these etching conditions.

The depth of the recess 64 was determined by cross-sectional TEM observations at a magnification of approximately 400,000 times. The depth (67 nm) obtained from cross-sectional TEM observations and the time required to etch to this depth were used to compute the rate of etching of the epitaxial substrate 12.

Figure 5B:
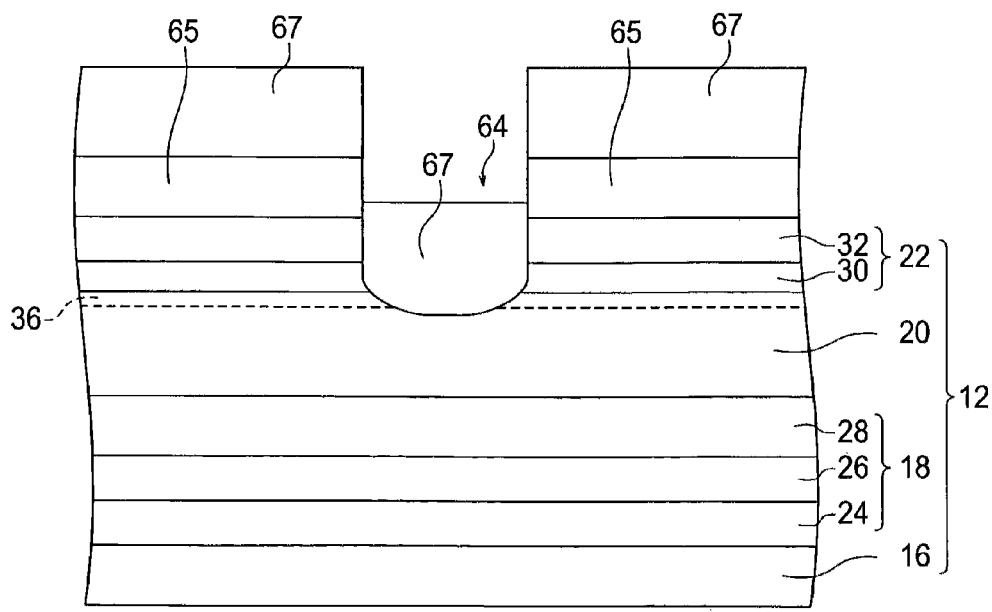
FIG. 5B is a process diagram following that of FIG. 5A.

(B3) Next, the structure shown in FIG. 5B is obtained. That is, in a state in which the photoresist 65 is left, Ti and Al are evaporation-deposited in this order as metal materials over the entirety of the epitaxial substrate 12, to form the metal film layer 67. By this means, the recess 64 is buried by the metal film layer 67. The Ti thickness is for example approximately 15 nm, and the Al thickness is for example approximately 200 nm.

(B4) Finally, the lift-off method is used to remove unnecessary Ti and Al together with the photoresist 65, so that an Al/Ti stacked structure is left only in the recess 64. Then, heat treatment is performed at a temperature of approximately 700° C. for about two to three minutes. By this means, the Ohmic electrode 62 shown in FIG. 1 is obtained, having a shape matching the recess 64, and in Ohmic contact with the electron transit layer 20.

Next, electrical characteristics of the above-described structure 60 and Ohmic electrode 62 will be explained. Specifically, through comparison with an electrode for comparison fabricated separately from the Ohmic electrode 62, the contact resistance between the Ohmic electrode 62 and the electron transit layer 20 is explained. In conjunction with this, the effect of this structure 60 in reducing contact resistance will be also explained.

Below, when there is no particular need for explicitness, "contact resistance between the Ohmic electrode 62 and the electron transit layer 20" will simply be called "contact resistance".

Figure 6A:
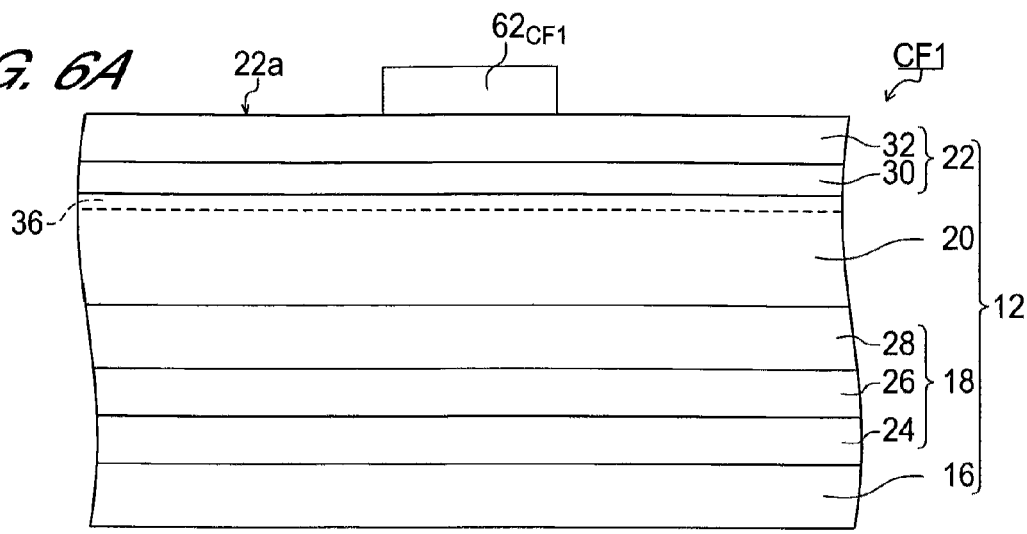
FIG. 6A is a view showing a cross-section of a first structure for comparison for comparing with a structure to reduce contact resistance of the first embodiment of the present invention.
Figure 6B:
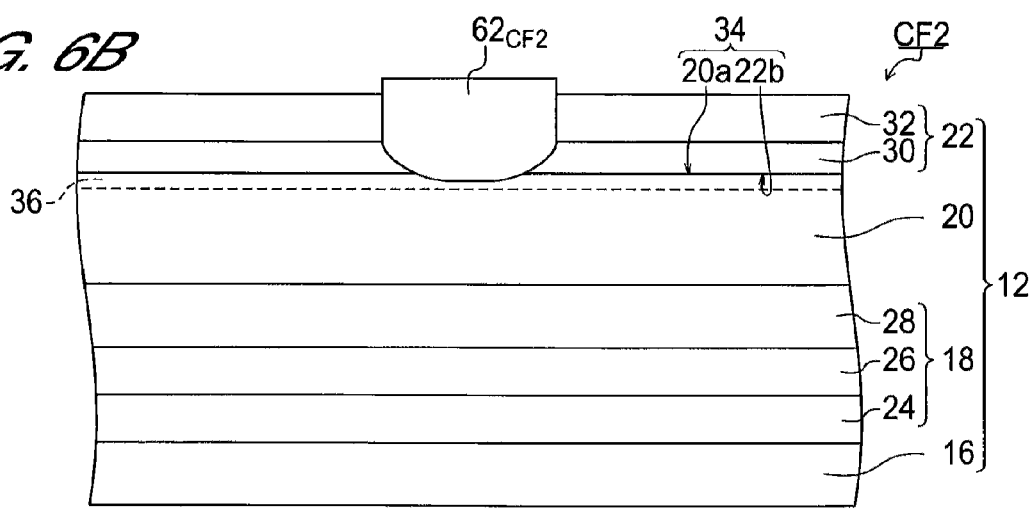
FIG. 6B is a view showing a cross-section of a second structure for comparison for comparing with a structure to reduce contact resistance of the first embodiment of the present invention.
Figure 6C:
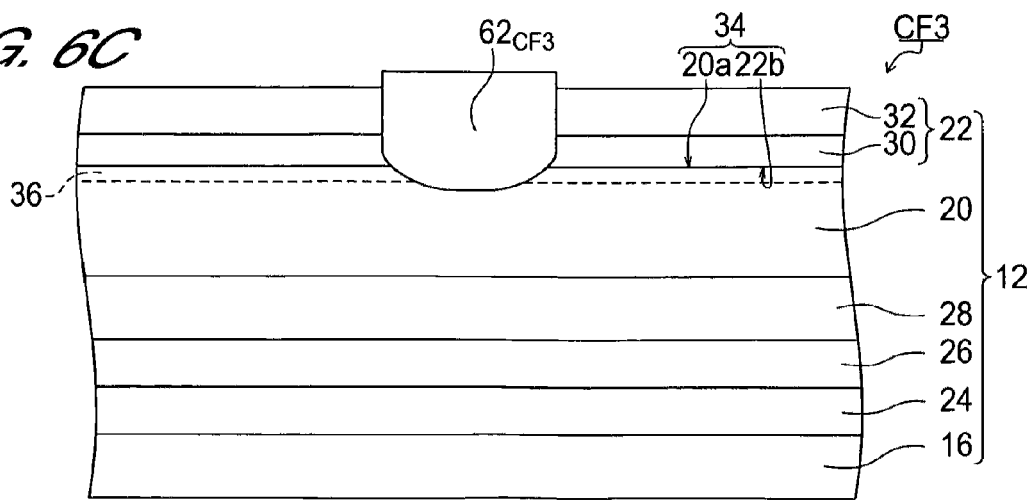
FIG. 6C is a view showing a cross-section of a third structure for comparison for comparing with a structure to reduce contact resistance of the first embodiment of the present invention.

In order to clarify the behavior of the contact resistance of an Ohmic electrode 62, in addition to the original structure 60, three types of structure for comparison, CF1, CF2 and CF3, were fabricated on an epitaxial substrate 12 (FIG. 6A through FIG. 6C).

In these structures for comparison CF1, CF2 and CF3, electrodes $62_{CF1}$, $62_{CF2}$ and $62_{CF3}$ corresponding to the Ohmic electrode 62 are formed. These electrodes $62_{CF1}$, $62_{CF2}$ and $62_{CF3}$ are formed using materials and structures same as those of the Ohmic electrode 62, except for the depth of extension of the electrode.

In the structure for comparison CF1 shown in FIG. 6A, the electrode $62_{CF1}$ is formed directly on the top face 22a of the electron supply layer 22. That is, in fabricating the structure for comparison CF1, the above-described process (B2) is omitted. Hence the structure for comparison CF1 does not have a recess 64.

In the structure for comparison CF2 shown in FIG. 6B, the depth of the electrode $62_{CF2}$ is 22 nm. The entire thickness of the electron supply layer 22 is 19 nm, and so in the structure for comparison CF2, the electrode $62_{CF2}$ intrudes into the electron transit layer 20 to a depth of approximately 3 nm past the heterointerface 34, and the lower end is in direct contact with the two-dimensional electron layer 36.

In the structure for comparison CF3 shown in FIG. 6C, the depth of the electrode $62_{CF3}$ is 44 nm. That is, in the structure for comparison CF3, the electrode $62_{CF3}$ intrudes into the electron transit layer 20 to a depth of approximately 25 nm past the heterointerface 34, and the lower end is in direct contact with the two-dimensional electron layer 36 and with the electron transit layer 20.

In fabricating the structures for comparison CF2 and CF3, etching conditions other than the etching time were the same as for the above-described process (B2). Hence the above-described etching rate (process (B2)) can be regarded as the same for the structures 60, CF2 and CF3. Hence the depths of the recess 64 (22 nm, 44 nm) in the structures for comparison CF2 and CF3 were determined by multiplying the etching rate by the respective etching times.

The structure for comparison CF1, the electrode depth of which is less than that of the heterointerface 34, is equivalent to technology of the related art, and does not belong to the technical scope of the invention. Further, the structures for comparison CF2 and CF3, the electrode depths of which are equal to or greater than the heterointerface 34, belong to the technical scope of the invention. Hence in the following, the electrodes $62_{CF2}$ and $62_{CF3}$ are respectively called "Ohmic electrodes $62_{CF2}$ and $62_{CF3}$".

A well-known method was used to evaluate the contact resistance for the original structure 60 and for the structures for comparison CF1, CF2, CF3.

Figure 7:
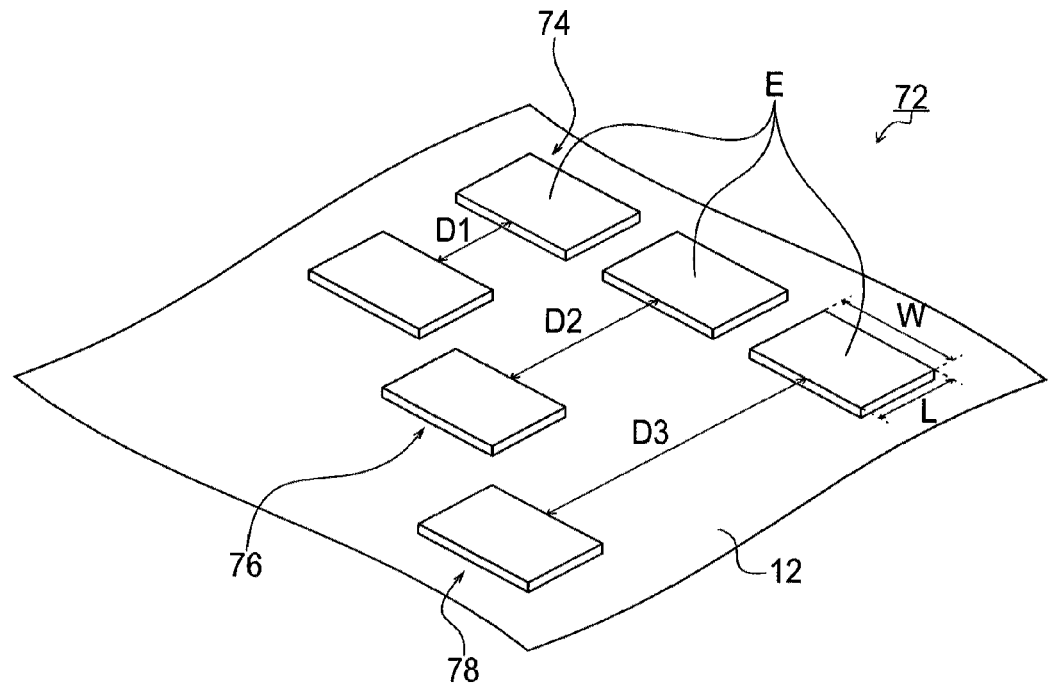
FIG. 7 is an oblique view for explaining a pattern for resistance evaluation of the first embodiment of the present invention.

Specifically, a pattern for resistance evaluation 72 was fabricated, having a planar shape as shown in FIG. 7, using the Ohmic electrodes 62, $62_{CF2}$ and $62_{CF3}$ and the electrode $62_{CF1}$ on a common epitaxial substrate 12.

This pattern for resistance evaluation 72 has the same planar shape and placement, except for using one among the Ohmic electrodes 62, $62_{CF2}$, $62_{CF3}$ or the electrode $62_{CF1}$ as the electrode E. Hence in the following explanation, a case is explained in which the Ohmic electrode 62 is used as the electrode E, that is, the contact resistance of the Ohmic electrode 62 is measured using the pattern for resistance evaluation 72. Hence where the following explanation applies to the structures for comparison CF1, CF2 or CF3, the electrode $62_{CF1}$ or the Ohmic electrodes $62_{CF2}$ and $62_{CF3}$ should be substituted for "electrode E".

FIG. 7 is a perspective view of the epitaxial substrate 12 on which the pattern for resistance evaluation 72 is formed.

The pattern for resistance evaluation 72 comprises three sub-patterns 74, 76, 78. Each of the sub-patterns 74, 76, 78 comprises a pair of mutually congruent rectangular electrodes E, E. As the electrodes E, Ohmic electrodes 62 are used.

The inter-electrode distances D1, D2, D3 between the electrodes E, E are different for each sub-pattern 74, 76, 78, and in the pattern for resistance evaluation 72 of FIG. 7, D1<D2<D3.

Here, the length W of the long edges of the electrodes E, E (hereafter called the electrode width W) is for example 20 μm, and the length L of the short edges (hereafter called the electrode length L) is for example 6 μm.

Figure 8:
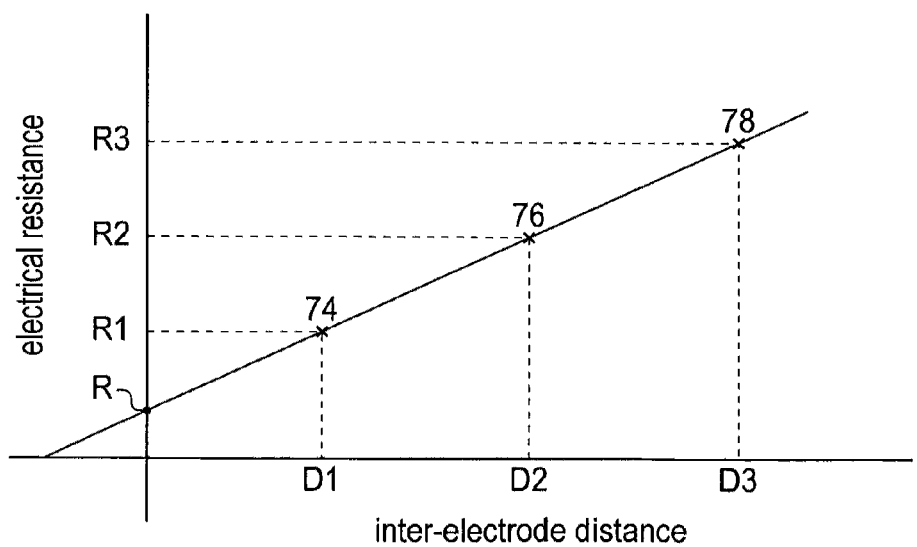
FIG. 8 shows the coordinate system used to determine contact resistance in the first embodiment of the present invention.

A well-known method is used to measure the electrical resistances R1, R2, R3 between the electrodes E, E for each of these sub-patterns 74, 76, 78. Then, the electrical resistances R1, R2, R3 are plotted together with the inter-electrode distances D1, D2, D3 in the coordinate system shown in FIG. 8. In FIG. 8, the vertical axis indicates the electrical resistance R normalized to an electrode width W of 1 mm, and the horizontal axis indicates the inter-electrode distance D. Each of the points on the graph is provided with the symbol of the corresponding sub-pattern (74, 76 or 78).

It is known that the graph obtained can be approximated by a first-degree (straight) line; one-half the resistance value (R) (=R/2) at the point of intersection of this first-degree (straight) line and the vertical axis was taken to be the contact resistance.

Figure 9:
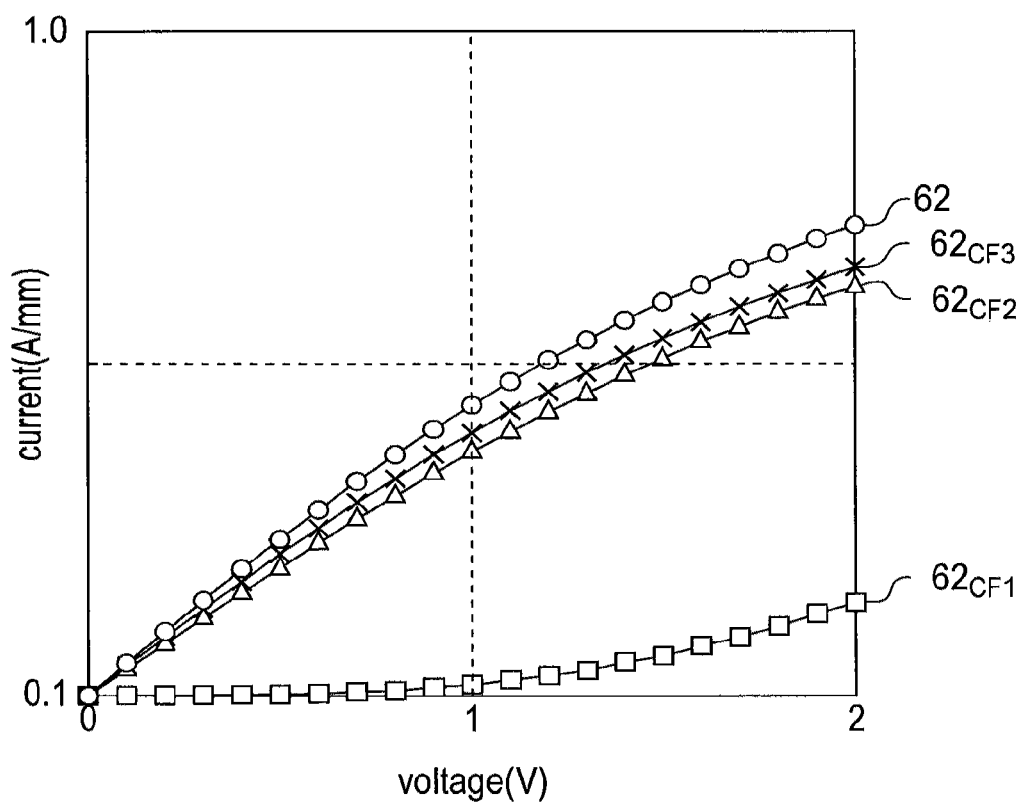
FIG. 9 shows the relation between the voltage across two electrodes and the current, in the pattern for resistance evaluation of the first embodiment of the present invention.
Figure 10:
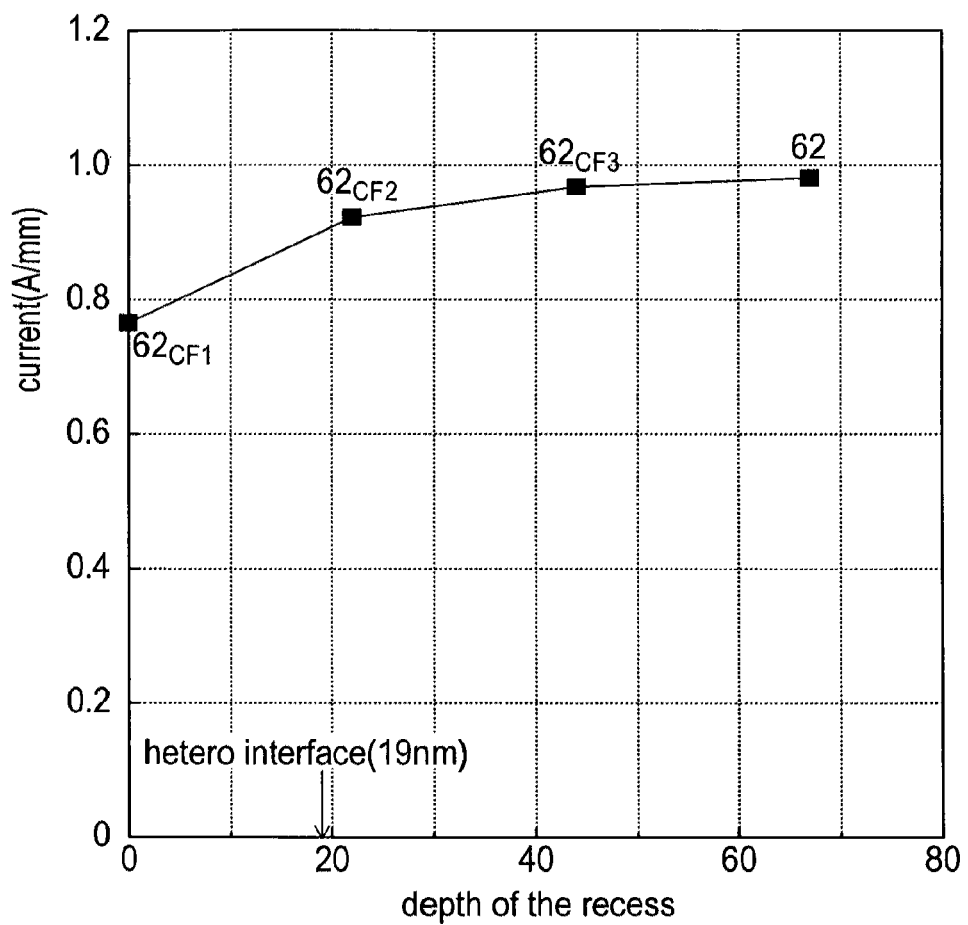
FIG. 10 shows the relation between the current flowing between two electrodes and the recess depth, when the applied voltage is fixed, in the first embodiment of the present invention.
Figure 11:
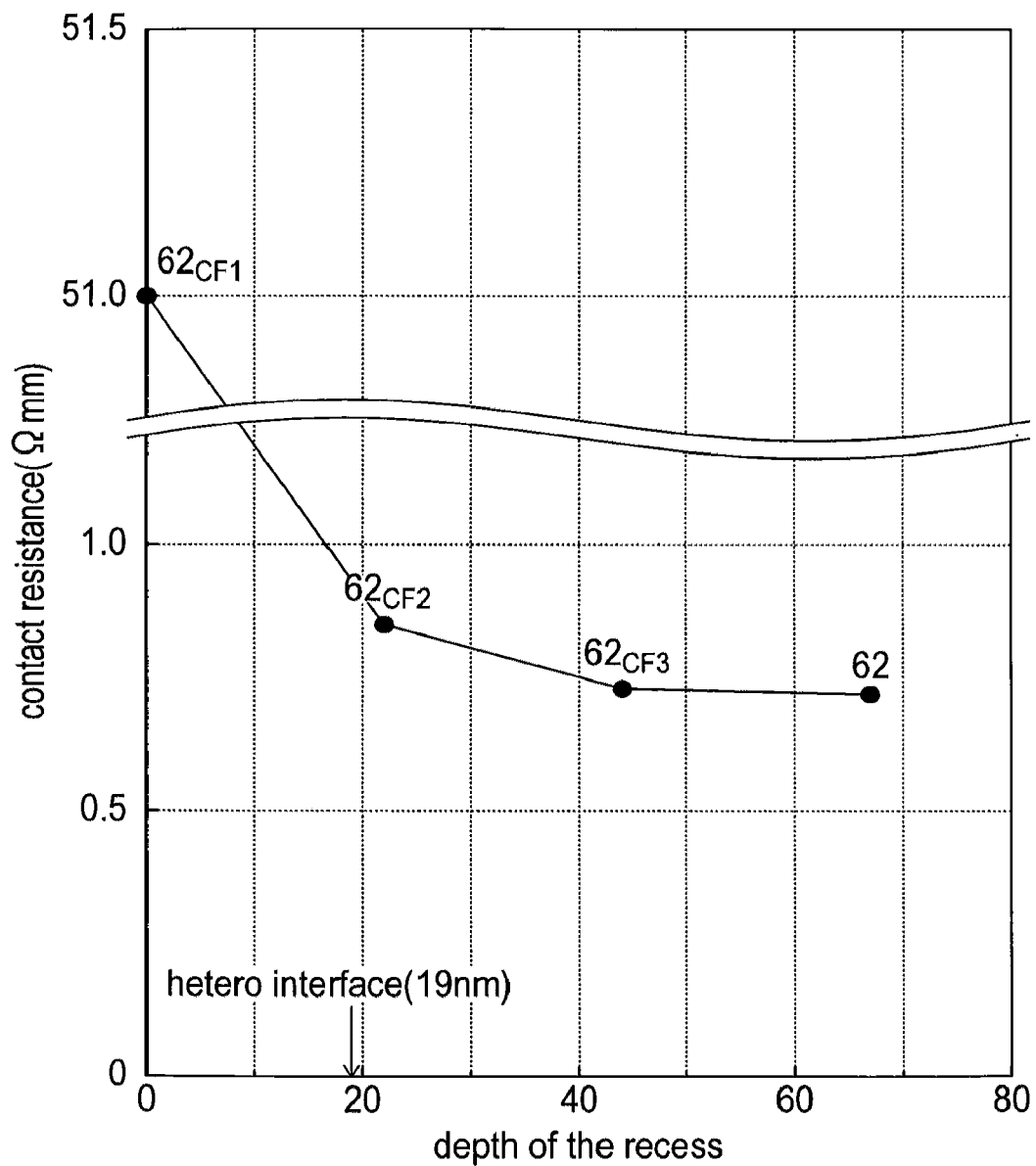
FIG. 11 shows the relation between contact resistance and recess depth in the first embodiment of the present invention.

FIG. 9 through FIG. 11 show the contact resistance and other electrical characteristics obtained by using, as the electrode E, the Ohmic electrodes 62, $62_{CF2}$ and $62_{CF3}$, and the electrode $62_{CF1}$.

FIG. 9 is a characteristic graph showing the voltage (V) applied across electrodes E, E (horizontal axis) versus the current flowing (A/mm) between the electrodes E, E (vertical axis), when the inter-electrode distance D1 of the pattern for resistance evaluation 72 is fixed at 3 μm. The vertical-axis units are normalized to an electrode width W of 1 mm.

In FIG. 9, four graphs are plotted. These graphs correspond, in order from the lowest, to the electrode $62_{CF1}$, the Ohmic electrode $62_{CF2}$, the Ohmic electrode $62_{CF3}$, and the Ohmic electrode 62.

As is clear from the characteristic graph of FIG. 9, at a voltage of 1 V or lower in the case of the electrode $62_{CF1}$, the current remains approximately 0 A even when a high voltage is applied. From this it is seen that there is no Ohmic contact in the case of the electrode $62_{CF1}$.

This is because the electrode $62_{CF1}$ is provided directly on the top face 22a of the electron supply layer 22, so that electrical conduction between the electrodes E, E is limited to the vicinity of the top face 22a of the electron supply layer 22. That is, in the case of the electrode $62_{CF1}$, the electron transit layer 20 with large electrical conductivity (and in particular the two-dimensional electron layer 36) contributes hardly at all to electrical conduction.

On the other hand, in the cases of the Ohmic electrodes $62_{CF2}$, $62_{CF3}$, 62, within the entire range of measured voltages, the applied voltage and the current are substantially proportional. From this it is seen that there is Ohmic contact between the Ohmic electrodes $62_{CF2}$, $62_{CF3}$, 62 and the electron transit layer 20.

This is because, in the cases of the Ohmic electrodes $62_{CF2}$, $62_{CF3}$, 62, electrical conduction between the electrodes E, E is primarily via the electron transit layer 20 (and in particular the two-dimensional electron layer 36).

On comparing the current values for the electrode $62_{CF1}$ and the Ohmic electrodes $62_{CF2}$, $62_{CF3}$ and 62, it is seen that the current flowing through the electron supply layer 22 is extremely small compared with the current flowing through the electron transit layer 20. Hence in the following explanation when considering the Ohmic electrodes $62_{CF2}$, $62_{CF3}$ and 62, the current can be assumed to be effectively flowing only through the electron transit layer 20, and the contribution of the electron supply layer 22 can be ignored.

Similarly with respect to the contact resistance described below, the contact resistance of the Ohmic electrodes $62_{CF2}$, $62_{CF3}$ and 62 is assumed to be effectively determined by the contact resistance with the electron transit layer 20, and the contribution of the electron supply layer 22 is ignored.

FIG. 10 is a characteristic graph showing the relation between the current (A) flowing between the electrodes E, E (vertical axis) and the depth (nm) of the recess 64 (horizontal axis), when the applied voltage is fixed at 1 V. The current values (vertical axis) are normalized to an electrode width W of 1 mm. The arrow at the horizontal axis in the figure indicates the depth corresponding to the heterointerface 34. Each of the points on the graph is provided with the symbol for the corresponding electrode (62, $62_{CF1}$, $62_{CF2}$, $62_{CF3}$).

According to the characteristic graph of FIG. 10, the current is approximately 0.77 A/mm for electrode $62_{CF1}$, with a recess 64 depth (etching depth) of 0 nm. The current is approximately 0.92 A/mm for Ohmic electrode $62_{CF1}$, with a depth of the recess 64 of 22 nm. The current is approximately 0.97 A/mm for the Ohmic electrode $62_{CF3}$, with a depth of the recess 64 of 44 nm. And for the Ohmic electrode 62 with a depth of the recess 64 of 67 nm, the current is approximately 0.98 A/mm.

From the characteristics of FIG. 10, it is seen that more current flows to the electron transit layer 20 from the Ohmic electrodes $62_{CF2}$, $62_{CF3}$ and 62, positioned at a depth equal to or greater than that of the heterointerface 34, than from the electrode $62_{CF1}$ positioned at a depth below that of the heterointerface 34.

Further, on comparing the Ohmic electrodes $62_{CF2}$, $62_{CF3}$ and 62, it is seen that the current flowing to the electron transit layer 20 increases with the depth of the Ohmic electrode.

FIG. 11 is a characteristic graph showing the relation between the contact resistance (Ω-mm) (vertical axis) as evaluated using the above-described method, and the depth (nm) of the recess 64 (horizontal axis). Here, the arrow at the horizontal axis in the figure indicates the depth corresponding to the heterointerface 34. Further, each of the points on the graph is provided with the symbol (62, $62_{CF1}$, $62_{CF2}$, $62_{CF3}$) of the corresponding electrode.

According to the characteristics shown in FIG. 11, the contact resistance is approximately 51 Ω-mm for the electrode $62_{CF1}$, with a depth of the recess 64 (etching depth) of 0 nm. The contact resistance is approximately 0.85 Ω-mm for the Ohmic electrode $62_{CF2}$, with a depth of the recess 64 of 22 nm. The contact resistance is approximately 0.73 Ω-mm for the Ohmic electrode $62_{CF3}$, with a depth of the recess 64 of 44 nm. And, the contact resistance is approximately 0.72 Ω-mm for the Ohmic electrode 62, with a depth of the recess 64 of 67 nm.

From the characteristics shown in FIG. 11, it is seen that the contact resistance is lower for the Ohmic electrodes 62, $62_{CF2}$ and $62_{CF3}$, positioned at a depth equal to or greater than that of the heterointerface 34, than for the electrode $62_{CF1}$ positioned at a depth less than that of the heterointerface 34.

Further, upon comparing the Ohmic electrodes $62_{CF2}$, $62_{CF3}$ and 62, it is seen that the contact resistance falls as the Ohmic electrode depth increases.

From the above explanation, it is seen that compared with the electrode $62_{CF1}$ positioned at a depth less than that of the heterointerface 34, the contact resistance is lower for the Ohmic electrodes $62_{CF2}$, $62_{CF3}$, 62 positioned at a depth equal to or greater than that of the heterointerface 34.

The reason for this is not clear, but it is thought to be likely that (1) the presence or absence of direct contact between the electrode and the two-dimensional electron layer 36, and (2) the magnitude of the contact area between the electrode and the two-dimensional electron layer 36, are related.

As an explanation in terms of (1), the electrode $62_{CF1}$ is positioned at a depth less than that of the heterointerface 34. That is, the electrode $62_{CF1}$ and the two-dimensional electron layer 36 are not in direct contact. Hence electrons flowing between the two-dimensional electron layer 36 and the electrode $62_{CF1}$ must pass through the spacer layer 30 and AlGaN layer 32.

In contrast, the Ohmic electrodes $62_{CF2}$, $62_{CF3}$, 62 are positioned at a depth equal to or greater than that of the heterointerface 34, and are in direct contact with the two-dimensional electron layer 36. Hence electrons flowing between the two-dimensional electron layer 36 and the Ohmic electrodes $62_{CF2}$, $62_{CF3}$, 62 can flow directly therebetween, without intervening obstacles.

It is inferred that as a result, the contact resistance is lower for the Ohmic electrodes $62_{CF2}$, $62_{CF3}$, 62 which are in direct contact with the two-dimensional electron layer 36 than for the electrode $62_{CF1}$.

As an explanation in terms of (2), in the Ohmic electrodes $62_{CF2}$, $62_{CF3}$, and 62, as the depth of the electrode increases, the contact area between the curved surface 68b and the two-dimensional electron layer 36, that is, the area of the current flow path, is inferred to be enlarged. As a result, it is thought that as the electrode depth increases, the contact resistance falls.

In this way, by means of the Ohmic electrode 62 of this aspect, the contact resistance with the electron transit layer 20 can be lowered compared with a case in which the electrode is positioned at a depth less than that of the heterointerface 34 (the electrode $62_{CF1}$).

Moreover, a curved surface 68b which is convex and directed outward from the Ohmic electrode 62 is provided at the lower end 66 of the Ohmic electrode 62, and this curved surface 68b is in oblique contact with the two-dimensional electron layer 36, so that the contact area between the Ohmic electrode 62 and the two-dimensional electron layer 36 is increased, and so the contact resistance between the Ohmic electrode 62 and the electron transit layer 20 is reduced.

Further, the structure 60 comprises an Ohmic electrode 62 positioned at a depth equal to or greater than that of the heterointerface 34, so that the contact resistance with the electron transit layer 20 can be reduced compared with a structure for comparison CF1 in which the electrode $62_{CF1}$ is positioned at a depth less than that of the heterointerface 34.

A detailed explanation will be given in a third embodiment, but the gas pressure (5.333 Pa) during etching by the ICP-RIE method in process (B2) can be set to an arbitrary appropriate pressure within the range 0.667 to 13.332 Pa, according to the design.

Details will be explained in the third embodiment, but at the depth of the heterointerface 34 (i.e., at the point where the Ohmic electrode contacts the heterointerface 34, as illustrated in FIG. 2), the angle θ on the acute-angle side made by the plane 68d tangent to the curved surface 68b and the plane of extension of the heterointerface 34 can be set to an arbitrary appropriate angle within the range greater than 0° and less than or equal to 56°, according to the design.

Further, according to evaluations by the inventors, the contact resistance can be reduced even when the Ohmic electrode 62 is formed on an epitaxial substrate 12 having a layered structure other than the structure explained in the first embodiment.

For example, the electron transit layer 20 may be of UID-GaN, and the region corresponding to the two-dimensional electron layer 36 may be GaN of conduction type n.

Further, by omitting the spacer layer 30 (AlN) in the electron supply layer 22, an AlGaN layer 32 may be provided directly on the top face 22a of the electron supply layer 22.

Also, the AlGaN layer 32 of the electron supply layer 22 may be UID-AlGaN, or AlGaN of conduction type n, or may have a three-layer structure in which AlGaN of conduction type n is sandwiched between two UID-AlGaN layers.

Further, UID-GaN may be layered as a cap layer on the top face 22a of the electron supply layer 22.

Further, the material and layered structure of the substrate 16 and base layer 18 are substantially unrelated to the action in reducing contact resistance of the Ohmic electrode 62. Hence various well-known materials and layered structures may be adopted in the substrate 16 and base layer 18.

Figure 22:
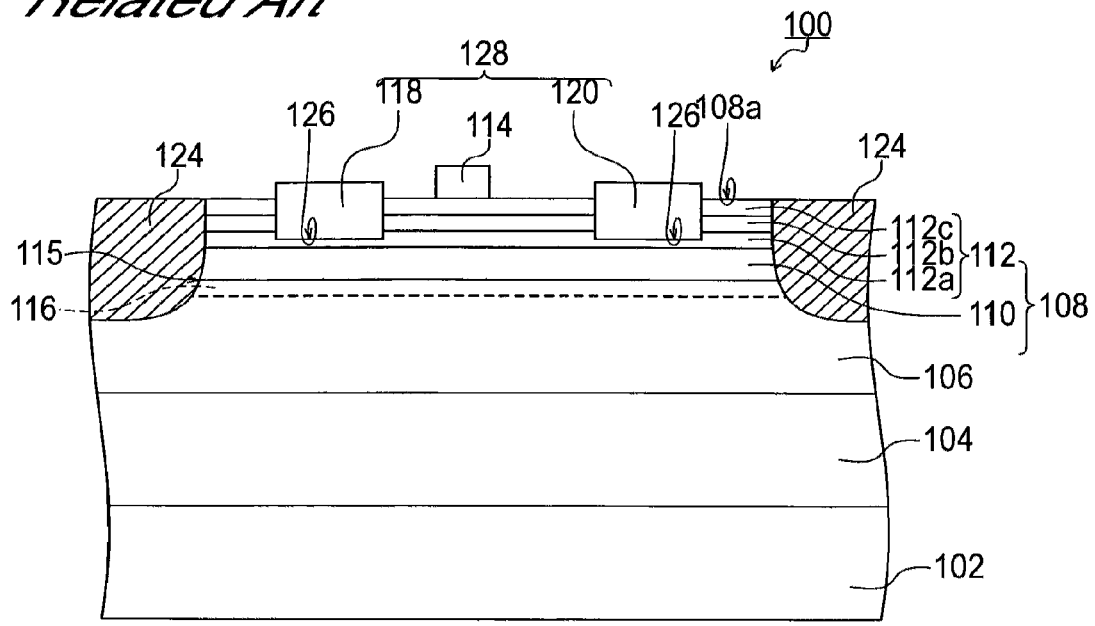
FIG. 22 is a view showing a cross-section of a HEMT of the prior art.

However, an exception is the HEMT 100 explained as technology of the related art. The inventors used a Si substrate in place of a sapphire substrate, and fabricated an epitaxial substrate having a layered structure similar to that of a HEMT 100 (FIG. 22) according to the method described in the above reference.

That is, an epitaxial substrate was fabricated comprising a Si substrate; a buffer layer 104 of AlN, of thickness approximately 1 μm, grown epitaxially on the Si substrate; an electron transit layer 106 of UID-GaN approximately 2 μm thick, formed on the buffer layer 104; an AlN layer 110 of thickness approximately 1 nm, formed on the electron transit layer 106; and, an AlGaN layer 112, formed on the AlN layer 110, formed by layering in order [UID-$Al_{0.26}Ga_{0.74}N$ (thickness: approximately 7 nm)], [n-$Al_{0.26}Ga_{0.74}N$ (thickness: approximately 15 nm, Si doping: $5 \times 10^{18}/cm^3$)], and [UID-$Al_{0.26}Ga_{0.74}N$ (thickness: approximately 3 nm)]. Then, a recess was provided in the epitaxial substrate, an electrode was formed in the recess, and the contact resistance was evaluated.

Figure 23:
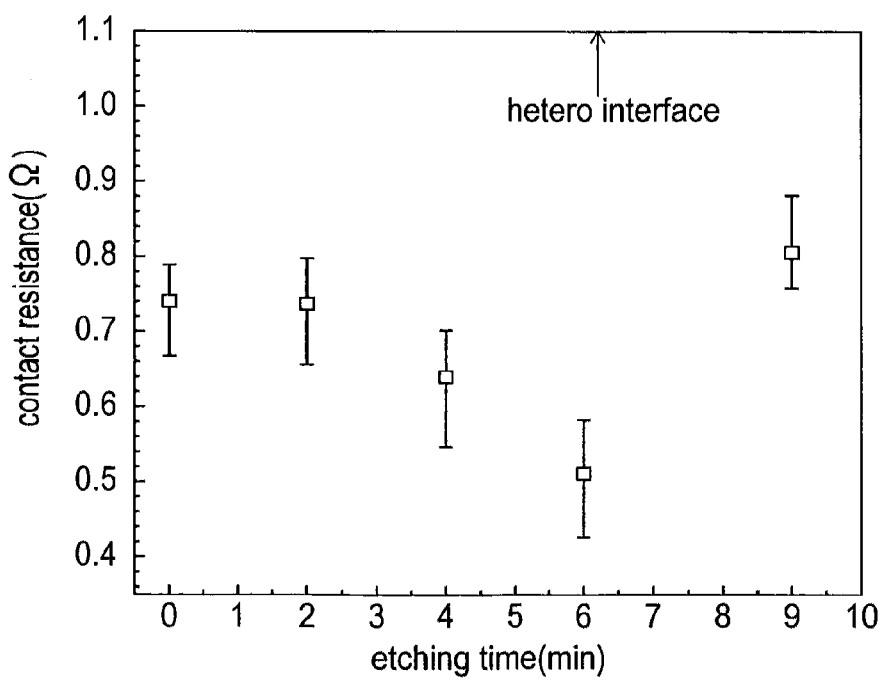
FIG. 23 is a diagram for explaining contact resistance in a HEMT of the prior art.

As a result, it was confirmed that in this epitaxial substrate, as explained in the technology of the related art (FIG. 23), when the electrode is provided at a thickness equal to or greater than the heterointerface, the contact resistance increases.

The reason for this is not clear at present. Consequently, Ohmic electrodes having a depth equal to or greater than the heterointerface, formed on an epitaxial substrate having a layered structure equivalent to a HEMT 100, are excluded from the technical scope of the invention. Similarly, Ohmic electrodes having a depth equal to or greater than the heterointerface, formed on an epitaxial substrate having a layered structure substantially the same as a HEMT 100 other than the sapphire substrate replaced with a Si substrate, are excluded.

Further, in the first embodiment the lower end 66 of the Ohmic electrode 62 was a convex portion 68 curved in a convex fashion outwards from the Ohmic electrode 62, and this convex portion 68 was provided with a curved surface 68b. However, in at least a portion of the region of contact C with the two-dimensional electron layer 36, if the normals 68c to the surface of the Ohmic electrode 62 are inclined with respect to the main face 16a of the substrate 16, then no particular constraints are placed on the shape of the lower end 66 of the Ohmic electrode 62.

Stated more specifically, in place of the curved surface 68b, the lower end 66 may comprise a flat face which is inclined with respect to the heterointerface 34.

For example, even when using an Ohmic electrode 62' with the cross-sectional shapes listed in the following (Shape 1) to (Shape 3), the contact resistance with the electron transit layer 20 can be reduced.

(Shape 1)

Figure 12A:
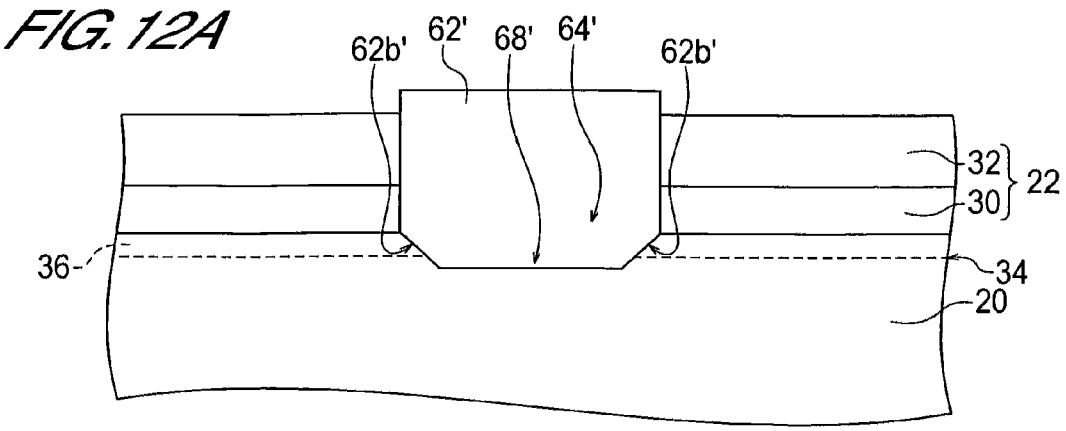
FIG. 12A shows a cross-section for explaining a modified example of an Ohmic electrode of the first embodiment of the present invention.

As shown in FIG. 12A, by adjusting the shape of the recess region 64', the Ohmic electrode 62' may be made to have a trapezoidal shape in cross-section in which the width of the cross-section of the convex portion 68' gradually decreases in moving toward the main face 16a of the substrate 16. In this case, the sloped faces 62b' on both sides of the trapezoid are in contact with the two-dimensional electron layer 36.

(Shape 2)

Figure 12B:
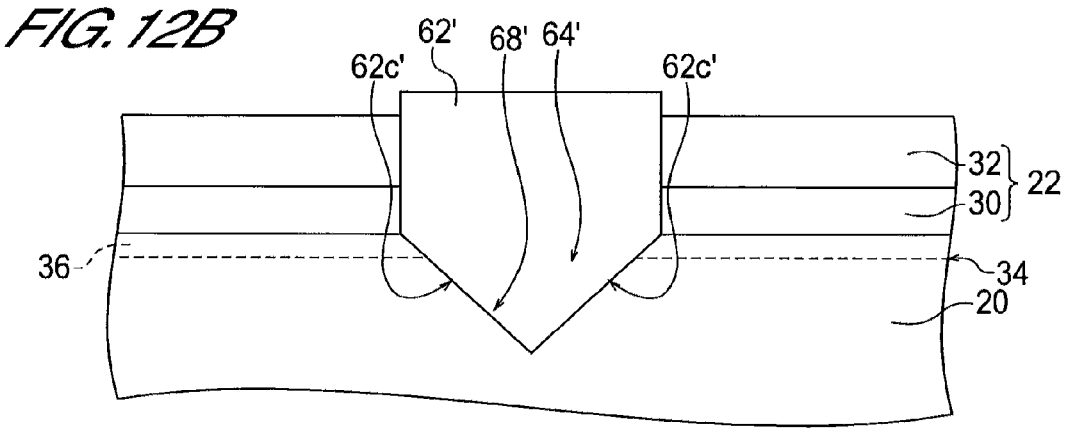
FIG. 12B shows a cross-section for explaining a modified example of an Ohmic electrode of the first embodiment of the present invention.

As shown in FIG. 12B, the Ohmic electrode 62' may have a wedge shape in cross-section in which the width of the convex portion 68' in cross-section gradually decreases in moving toward the main face 16a of the substrate 16. In this case, the sloped faces 62c' on both sides of the wedge are in contact with the two-dimensional electron layer 36.

(Shape 3)

Figure 12C:
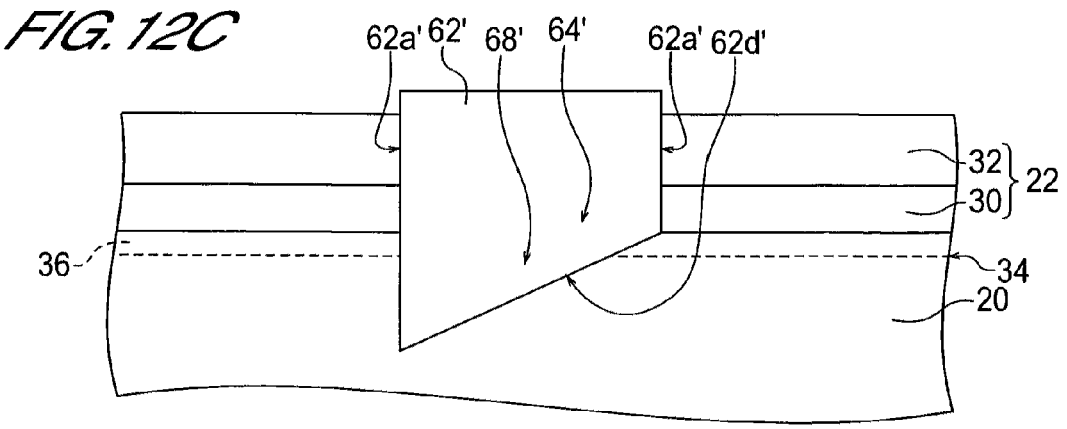
FIG. 12C shows a cross-section for explaining a modified example of an Ohmic electrode of the first embodiment of the present invention.

As shown in FIG. 12C, the Ohmic electrode 62' may have a cross-sectional shape which would result from obliquely slicing only one side face 62a' of the Ohmic electrode 62'. In this case, the sliced face 62d', which is inclined with respect to the heterointerface 34, and the other side face 62a' are in contact with the two-dimensional electron layer 36.

From FIG. 11, it is seen that when this epitaxial substrate 12 is used, a depth for the Ohmic electrode 62 of 22 nm or greater is appropriate. In other words, it is preferable that the length of the portion of the Ohmic electrode 62 exceeding the heterointerface 34 and intruding into the electron transit layer 20, that is, the length of the convex portion 68, be 3 nm or greater. Further, according to FIG. 11 a tendency is seen for the contact resistance to decrease with increasing depth up to at least a depth of 67 nm. Hence the lengths for the convex portion 68 are preferable within the range of 3 nm or greater and 48 nm or less.

The above is the appropriate range of depths for the Ohmic electrode 62 as confirmed in experiments; however, the inventors surmise that the contact resistance will take on a minimum value at a certain depth.

This inference is based on the fact that the slope of the graph in FIG. 11 is gentle with increasing depth, and on the fact that, considering the shape of the Ohmic electrode 62, when a certain depth is exceeded the contact area of the Ohmic electrode 62 with the two-dimensional electron layer 36 decreases.

Second Embodiment

A field effect transistor (HEMT) and method of manufacturing a field effect transistor of a second embodiment are explained, referring to FIG. 13 through FIG. 18.

The HEMT 10 of this aspect is formed on the epitaxial substrate 12 explained in the first embodiment. In the HEMT 10, the Ohmic electrode 62 explained in the first embodiment is used, with only the plane view shape modified, as the source electrode 40 and drain electrode 42. Hence in FIG. 13, the same symbols are assigned to the same constituent elements as in FIG. 1, and explanations are omitted as appropriate.

The configuration example shown in FIG. 13 will be explained. The HEMT 10 comprises the epitaxial substrate 12 and the FET structure 14 formed on the epitaxial substrate 12.

The FET structure 14 comprises the isolation layer 38, source electrode 40, drain electrode 42, and gate electrode 44.

The isolation layer 38 is insulating regions to electrically separate the HEMT 10 from other adjacent devices. Similarly to the explanation of the technology of the related art, the isolation layer 38 is provided at a distance, surrounding the device region. The isolation layer 38 is formed extending from the top face 22a of the electron supply layer 22 to the electron transit layer 20 at a depth below the two-dimensional electron layer 36.

The source electrode 40 and drain electrode 42 are electrodes in Ohmic contact with the electron transit layer 20. The source electrode 40 and drain electrode 42 are provided in the device region between the isolation layers 38, 38, at a distance from the isolation layers 38, 38. The source electrode 40 and drain electrode 42 are formed with a space therebetween, and in this space the gate electrode 44 is provided.

The source electrode 40 and drain electrode 42 are provided so as to bury recesses 40a, 42a, which are depressions formed to a depth equal to or greater than that of the heterointerface 34. The source and drain electrodes 40, 42 have structures similar to that of the Ohmic electrode 62 described in the first embodiment, other than being formed in the shape required for operation of a planar-shaped HEMT 10.

In the following explanation, when there is no need in particular to distinguish between the source electrode 40 and the drain electrode 42, the two are together called an Ohmic electrode 48.

The gate electrode 44 is provided as a Schottky junction with the electron supply layer 22 on the top face 22a of the electron supply layer 22, between the source electrode 40 and the drain electrode 42.

The gate electrode 44 is formed by, for example, layering approximately 50 nm of Ni and approximately 500 nm of Au in this order on the top face 22a of the electron supply layer 22, and then performing heat treatment at for example approximately 600 to 900° C.

Next, a method of manufacturing a HEMT 10 will be explained, referring to FIG. 14.

Processes to manufacture a HEMT 10 may be broadly divided into (A) processes to manufacture the epitaxial substrate 12, and (C) processes to manufacture the FET structure 14. Here, the processes (A) have already been explained in the first embodiment, and so a redundant explanation is omitted.

(C) Processes to Manufacture a FET Structure 14

Figure 14A:
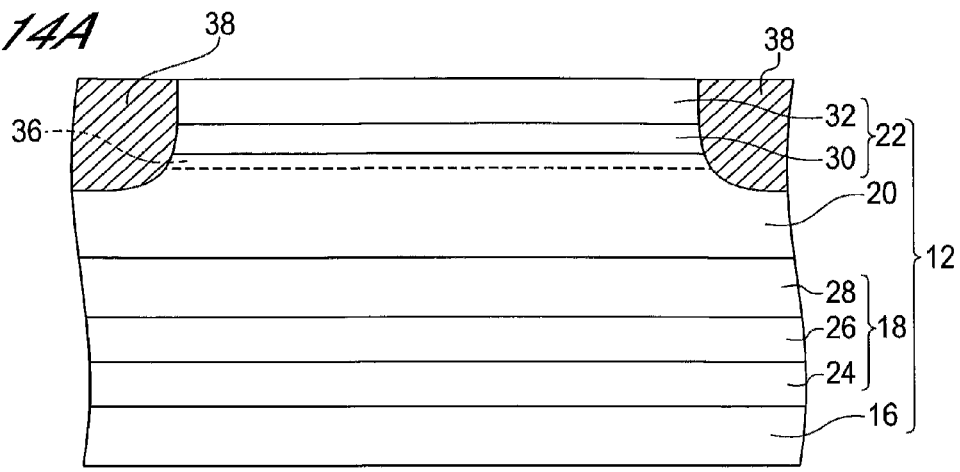
FIG. 14A is a process diagram for explaining a method of manufacturing a HEMT of the second embodiment of the invention.

(C1) First, the structure shown in FIG. 14A is obtained. That is, isolation layer 38 is formed on the epitaxial substrate 12. In greater detail, Ar ions are implanted to a depth exceeding the two-dimensional electron layer 36 after covering the surface with photoresist or another ion implantation protection film, excluding the region for formation of the isolation layer 38. Then, the ion implantation protection film is removed by a well-known method. By this means, the crystal structure is destroyed in the electron supply layer 22 and electron transit layer 20 within the ion-implanted region, and as a result the region is rendered insulating, to form isolation layer 38.

Figure 14B:
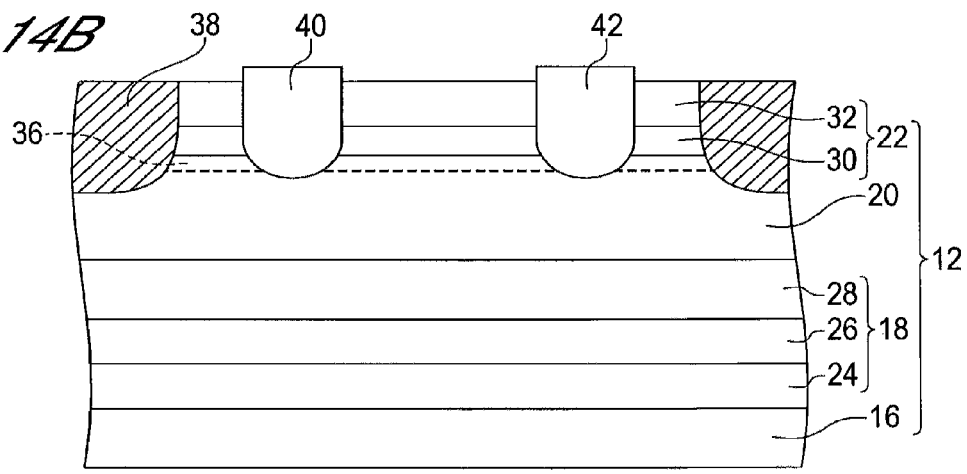
FIG. 14B is a process diagram following that of FIG. 14A.

(C2) Next, the structure shown in FIG. 14B is obtained. That is, the source and drain electrodes 40, 42 are formed. The specific procedures of this process are similar to processes (B) explained in the first embodiment, and so a redundant explanation is omitted.

Figure 14C:
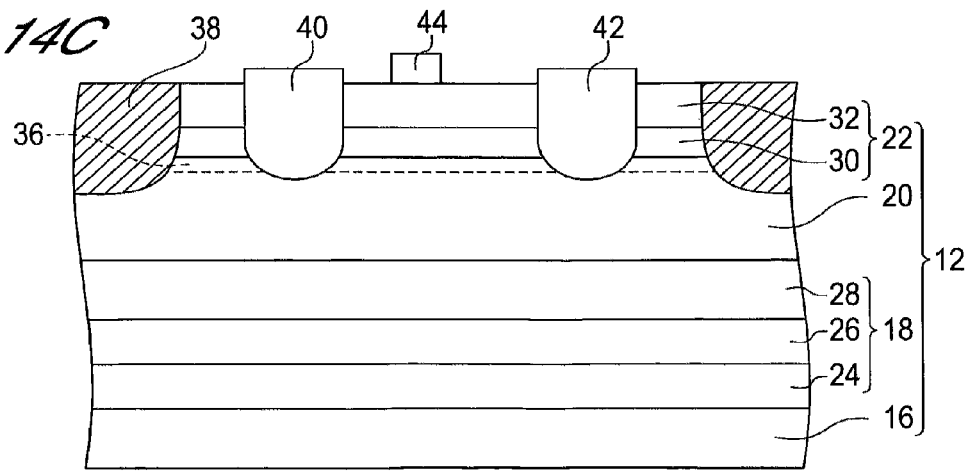
FIG. 14C is a process diagram following that of FIG. 14B.

(C3) Next, the structure shown in FIG. 14C is obtained. That is, the gate electrode 44 is formed. In greater detail, photolithography techniques are used to cover the region other than the region for formation of the gate electrode 44 with photoresist. On this, approximately 50 nm of Ni and approximately 500 nm of Au are deposited in this order by vacuum evaporation. Then, the lift-off method is used to remove unnecessary Ni and Au together with the photoresist, leaving an Au/Ni layered structure only in the region corresponding to the gate electrode 44. After this heat treatment is performed at a temperature of approximately 700° C. for about two to three minutes, to obtain a gate electrode 44 joined by a Schottky junction to the electron supply layer 22, existing between the source and drain electrodes 40, 42. The gate length of the gate electrode 44, that is, the length of the gate electrode 44 in the lateral direction in FIG. 14C, is for example 1 μm. The gate width of the gate electrode 44, that is, the length of the gate electrode 44 in the direction perpendicular to the plane of the paper in FIG. 14C, is for example 10 μm.

Figure 13:
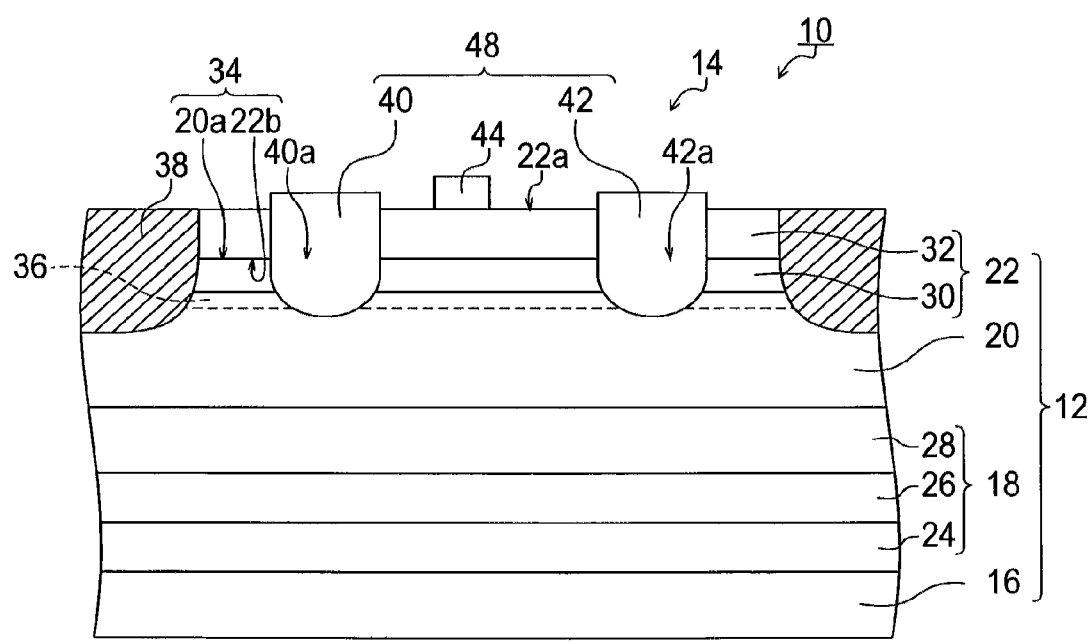
FIG. 13 is a view showing a cross-section of a HEMT of the second embodiment of a field effect transistor according to the invention.

By this means, the HEMT 10 shown in FIG. 13 is obtained.

Next, electrical characteristics of the HEMT 10 are explained. Specifically, various characteristics of the HEMT 10 are explained through comparisons with HEMTs for comparison, fabricated separately from the HEMT 10.

Figure 15A:
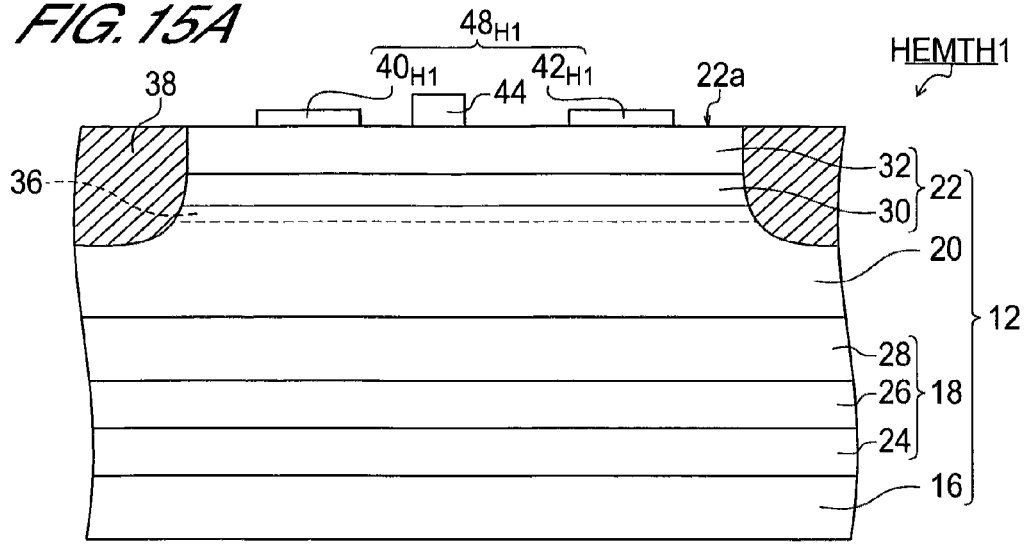
FIG. 15A is a view showing a cross-section of a first HEMT for comparison for comparing with the HEMT of the second embodiment of the invention.
Figure 15B:
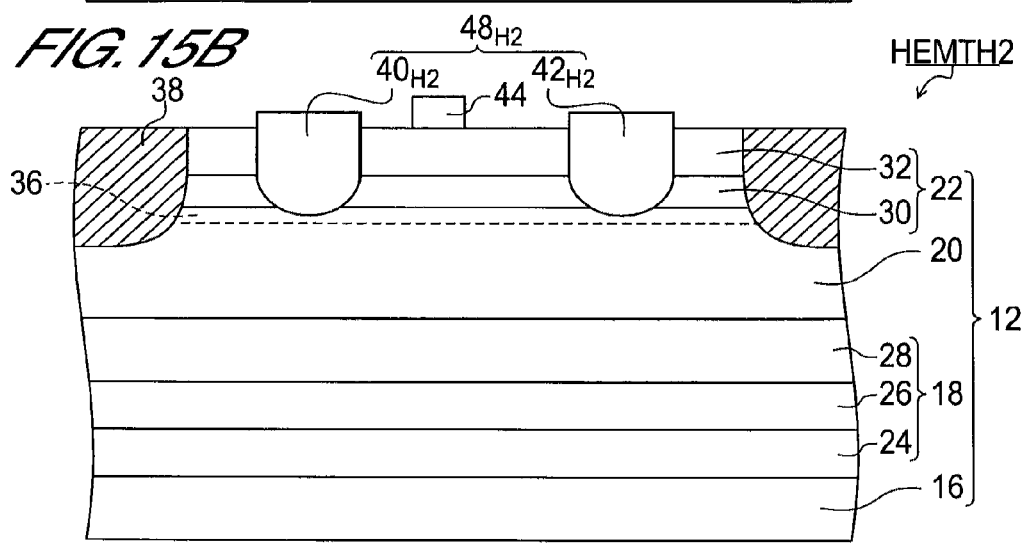
FIG. 15B is a view showing a cross-section of a second HEMT for comparison for comparing with the HEMT of the second embodiment of the invention.
Figure 15C:
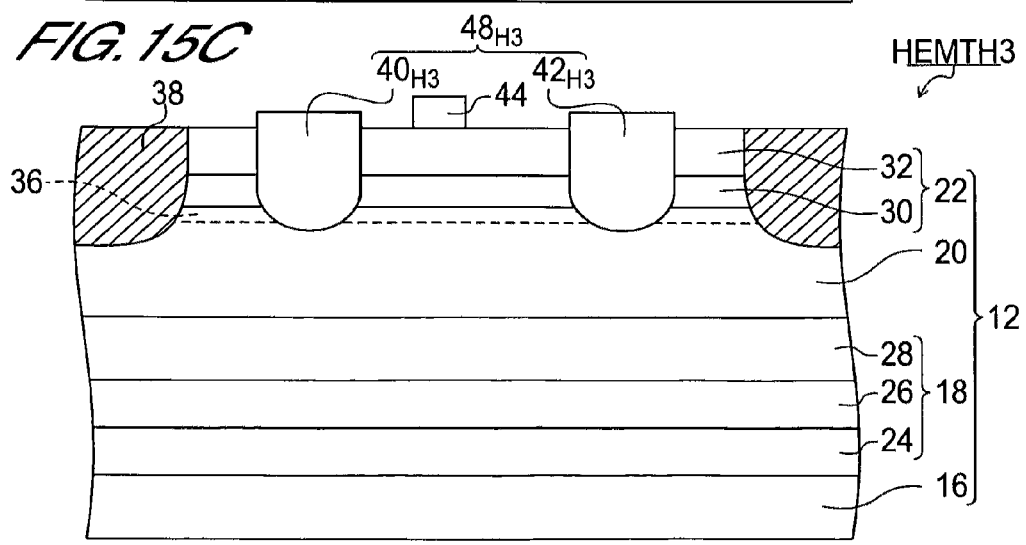
FIG. 15C is a view showing a cross-section of a third HEMT for comparison for comparing with the HEMT of the second embodiment of the invention.

Three types of HEMTs for comparison H1, H2, H3 were fabricated, in addition to the HEMT 10, on an epitaxial substrate 12 (FIG. 15A through FIG. 15C).

Electrodes $48_{H1}$, $48_{H2}$ and $48_{H3}$, corresponding to the Ohmic electrode 48, are formed in these HEMTs for comparison H1, H2, H3. The HEMTs H1, H2, H3 are similar to the HEMT 10, except in that the depths of the electrodes $48_{H1}$, $48_{H2}$ and $48_{H3}$ are different.

In the HEMT H1 shown in FIG. 15A, the electrodes $48_{H1}$ comprise source and drain electrodes $40_{H1}$ and $42_{H1}$. The electrodes $48_{H1}$ have a structure similar to the electrode $62_{CF1}$ described in the first embodiment, except for the different planar shape. That is, in the HEMT H1, the electrodes $48_{H1}$ are formed directly on the top face 22a of the electron supply layer 22.

In the HEMT H2 shown in FIG. 15B, the electrodes $48_{H2}$ comprise source and drain electrodes $40_{H2}$, $42_{H2}$. The electrodes $48_{H2}$ have a structure similar to the electrode $62_{CF2}$ described in the first embodiment, except for the different planar shape. That is, in the HEMT H2, the electrodes $48_{H2}$ have a depth of 22 nm.

In the HEMT H3 shown in FIG. 15C, the electrodes $48_{H3}$ comprise source and drain electrodes $40_{H3}$, $42_{H3}$. The electrodes $48_{H3}$ have a structure similar to the electrode $62_{CF3}$ described in the first embodiment, except for the different planar shape. That is, in the HEMT H3, the electrodes $48_{H3}$ have a depth of 44 nm.

The depth of the electrodes $48_{H1}$ in the HEMT H1, which is less than the depth of the heterointerface 34, corresponds to the technology of the related art, and does not belong to the technical scope of the invention. The HEMTs H2, H3, in which the electrodes $48_{H2}$, $48_{H3}$ are of depth equal to or greater than that of the heterointerface 34, belong to the technical scope of the invention. Hence in the following, the electrodes $48_{H2}$, $48_{H3}$ are called "Ohmic electrodes $48_{H2}$, $48_{H3}$".

Figure 16A:
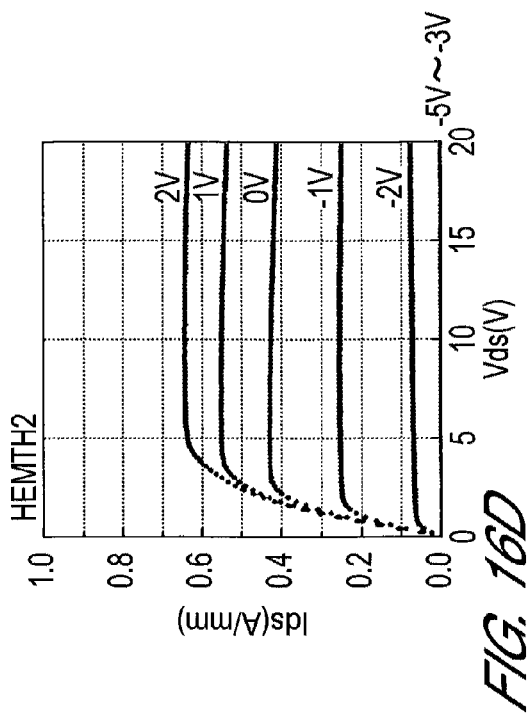
FIG. 16A shows the I-V characteristic of the first HEMT for comparison in the second embodiment of the invention.
Figure 16B:
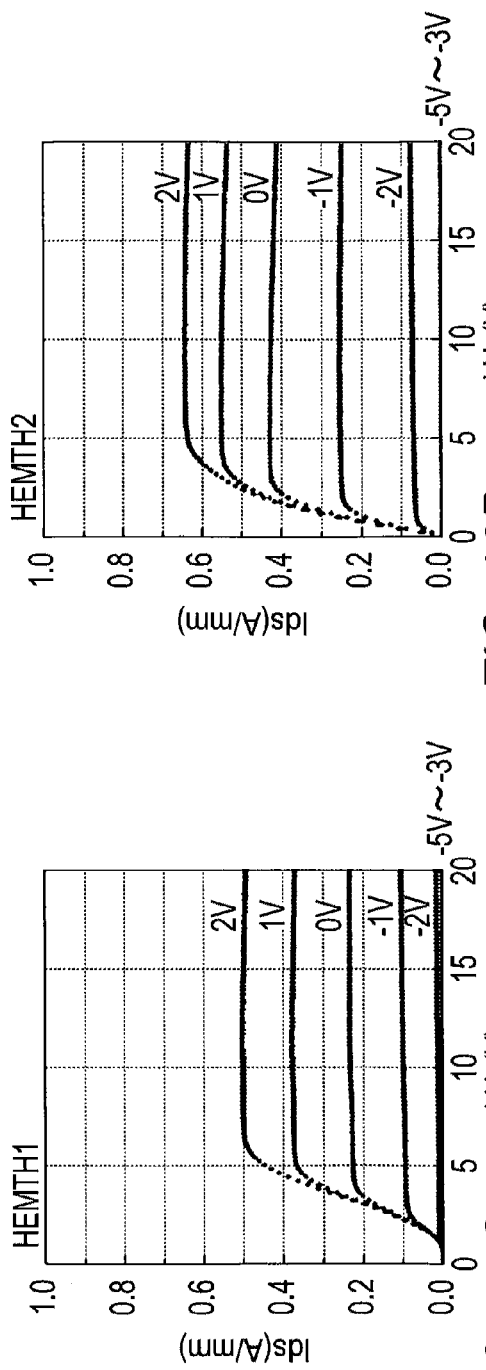
FIG. 16B shows the I-V characteristic of the second HEMT for comparison in the second embodiment of the invention.
Figure 16C:
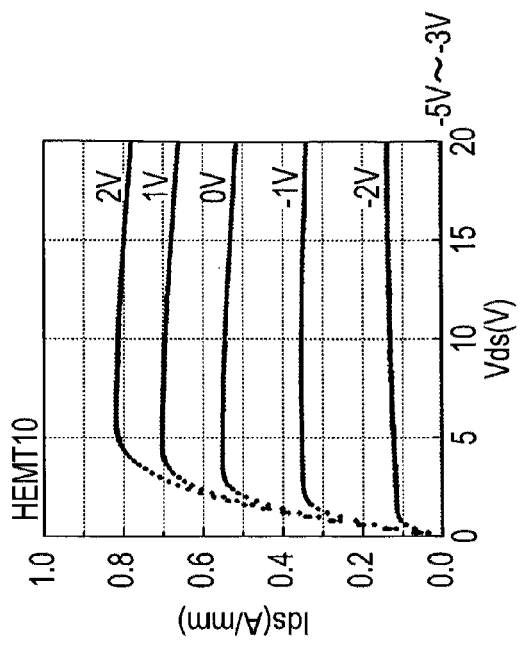
FIG. 16C shows the I-V characteristic of the third HEMT for comparison in the second embodiment of the invention.
Figure 16D:
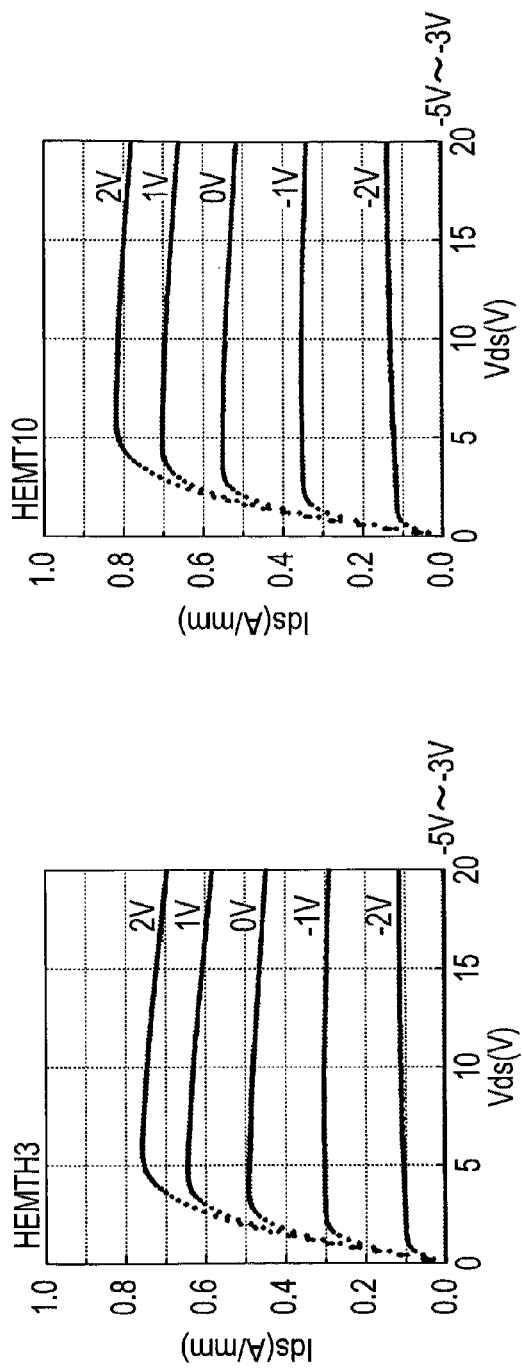
FIG. 16D shows the I-V characteristic of the HEMT in the second embodiment of the invention.
Figure 17:
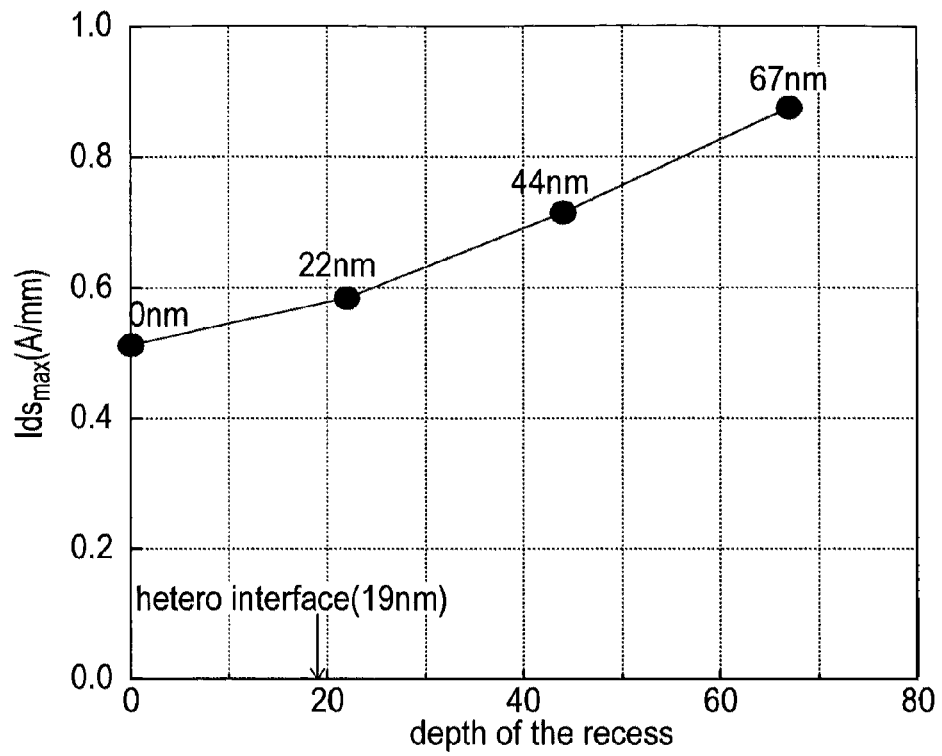
FIG. 17 shows the relation between the maximum value of the drain current and the recess depth when the gate voltage is fixed at +2 V, for the HEMT of the second embodiment of the invention.
Figure 18:
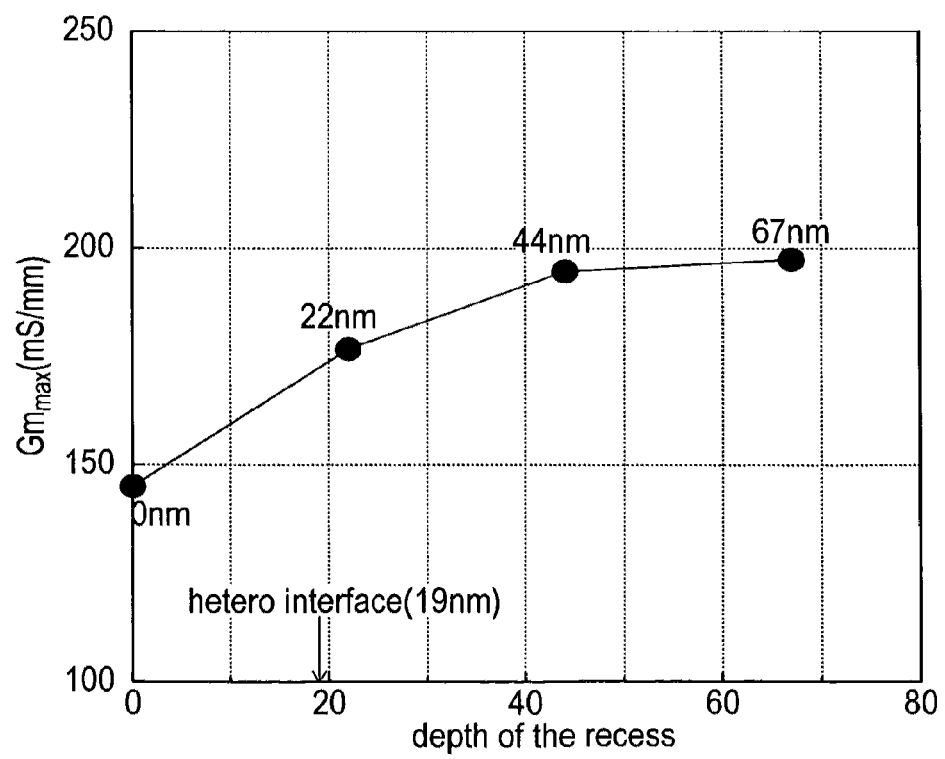
FIG. 18 shows the relation between maximum transconductance and recess depth, for the HEMT of the second embodiment of the invention.

FIG. 16 through FIG. 18 show the I-V characteristics and other electrical characteristics of the HEMTs H1, H2, H3, 10.

FIG. 16A through FIG. 16D show the I-V characteristics for HEMTs H1, H2, H3, 10.

The I-V characteristics indicate the relation between the drain voltage Vds (horizontal axis) and drain current Ids (vertical axis), when the voltage Vg applied to the gate electrode 44 (hereafter also called the gate voltage) is varied from −5 V to 2 V in 1 V steps, the source electrodes $40_{H1}$, $40_{H2}$, $40_{H3}$, 40 are grounded, and the voltage Vds applied to the drain electrodes $42_{H1}$, $42_{H2}$, $42_{H3}$, 42 (hereafter also called the drain voltage) is varied between 0 V and 20 V.

Here, the units of the horizontal axes are V, and the vertical axis units are A/mm. The drain current Ids indicated along the vertical axis is normalized to a width of 1 mm for the drain electrodes $42_{H1}$, $42_{H2}$, $42_{H3}$, 42. Also, each of the graphs is provided with the value of the corresponding gate voltage Vg.

From FIG. 16A, in the HEMT H1, the increase in drain current Ids is gradual over the range of drain voltages Vds from 0 V to 3 V. As explained in the first embodiment, this corresponds to the fact that Ohmic contact is not established between the electrode $48_{H1}$ and the electron transit layer 20.

From FIG. 16B through FIG. 16D, a sharp increase is observed in the drain current Ids from a drain voltage Vds of 0 V in the case of the HEMTs H2, H3, 10, for which Ohmic contact with the electron transit layer 20 is established.

Apart from the HEMTs H1, H2, H3 and 10, the inventors also fabricated more than ten HEMTs with each of the recess 64 depths of 0 nm, 22 nm, 44 nm, and 67 nm. FIG. 17 and FIG. 18 show the electrical characteristics of these HEMTs.

In the interest of facilitating understanding, in the following explanation the plurality of HEMTs formed with depths of the recess 64 of 0 nm, 22 nm, 44 nm and 67 nm are respectively represented by the above HEMTs H1, H2, H3, 10, using as symbols H1, H2, H3, and 10.

FIG. 17 is a characteristic graph showing the relation between the maximum value Ids (A/mm) of the drain current Ids (vertical axis) and the depth (nm) of the recess 64 (horizontal axis), when the gate voltage Vg was fixed at +2 V.

The values of $Ids_{max}$ shown in FIG. 17 are simple averages for the pluralities of HEMTs fabricated with each of the depths of the recess 64.

The arrow at the horizontal axis indicates the depth corresponding to the heterointerface 34. The depth of the recess 64 for each HEMT is indicated at each point on the graph.

According to the characteristics shown in FIG. 17, the average value of $Ids_{max}$ is approximately 0.5 A/mm for HEMTs H1 with a depth of the recess 64 (etching depth) of 0 nm. HEMTs H2 with a depth of recess 64 of 22 nm had an average value of $Ids_{max}$ of approximately 0.6 A/mm. The average value of $Ids_{max}$ for HEMTs H3 with a depth of recess 64 of 44 nm is approximately 0.7 A/mm. The average value of $Ids_{max}$ for HEMTs 10 with a depth of recess 64 of 67 nm is approximately 0.9 A/mm.

In this way, HEMTs 10, H2, H3 in which Ohmic electrodes 48, $48_{H2}$, $48_{H3}$ are positioned at a depth equal to or greater than that of the heterointerface 34 have a larger $Ids_{max}$, and hence a larger source-drain current, than HEMTs H1 in which electrodes $48_{H1}$ are positioned at a depth less than that of the heterointerface 34.

FIG. 18 is a characteristic graph showing the relation between the HEMT maximum transconductance $Gm_{max}$ (mS/mm) (vertical axis) and the depth of the recess 64 (nm) (horizontal axis). The value of the maximum transconductance $Gm_{max}$ is also a simple average over the plurality of HEMTs fabricated with each depth of the recess 64.

The arrow at the horizontal axis in the figure indicates the depth corresponding to the heterointerface 34. Also, the depth of the recess 64 for the HEMT is indicated at each point on the graph.

Here, the maximum transconductance $Gm_{max}$ is a quantity relating to the HEMT operating properties in the high-frequency range and to the output power. The larger the maximum transconductance $Gm_{max}$, the higher the frequencies at which operation is possible, and the greater the output power obtained. The maximum transconductance $Gm_{max}$ is defined as the maximum value of the rate of change of the drain current Ids with changes in the gate voltage Vg, when the drain voltage Vds is held constant.

According to the characteristics shown in FIG. 18, the HEMTs H1 with a depth of recess 64 (etching depth) of 0 nm have a $Gm_{max}$ of approximately 140 mS/mm. HEMTs H2 having a depth of recess 64 of 22 nm have a $Gm_{max}$ of approximately 177 mS/mm. HEMTs H3 having a depth of recess 64 of 44 nm have a $Gm_{max}$ of approximately 195 mS/mm. And, HEMTs 10 having a depth of recess 64 of 67 nm have a $Gm_{max}$ of approximately 197 mS/mm.

In this way, HEMTs 10, H2, H3 in which the Ohmic electrodes 48, $48_{H2}$, $48_{H3}$ are positioned at a depth equal to or greater than that of the heterointerface 34 have a higher $Gm_{max}$ than HEMTs H1 in which the electrode $48_{H1}$ is positioned at a depth less than that of the heterointerface 34, and boast superior operating characteristics at high frequencies and higher output power.

Thus the HEMTs 10 of the second embodiment employ the Ohmic electrode 62 of the first embodiment as the source and drain electrodes 40, 42. By this means, contact resistance between the source and drain electrodes 40, 42 and the electron transit layer 20 is reduced in HEMTs 10 compared with HEMTs H1 in which electrodes are positioned at a depth less than that of the heterointerface 34. As a result, the source-drain current, that is, the drain current Ids, as well as the maximum transconductance $Gm_{max}$, are increased. Consequently, the output power from a HEMT 10 is greater than that from a HEMT H1.

In the HEMT 10 of the second embodiment, both the source and drain electrodes 40, 42 adopt a structure similar to that of an Ohmic electrode 62. However, only one among the source and drain electrodes 40, 42 may adopt a structure similar to an Ohmic electrode 62. In this case, the performance will be inferior to that of the HEMT 10, but an increase the drain current and an increase in the maximum transconductance which are adequate for practical purposes may be obtained.

Further, a HEMT 10 of the second embodiment comprises source and drain electrodes 40, 42 with structures similar to those of the Ohmic electrode 62, and so modifications similar to those described in the first embodiment are possible. That is, the gas pressure during dry etching, the layered structure of the epitaxial substrate 12, the shape of the lower end 66 of the source and drain electrodes 40, 42 and the depths of the source and drain electrodes 40, 42 can be modified similarly to the case of the Ohmic electrode 62.

Third Embodiment

Figure 19:
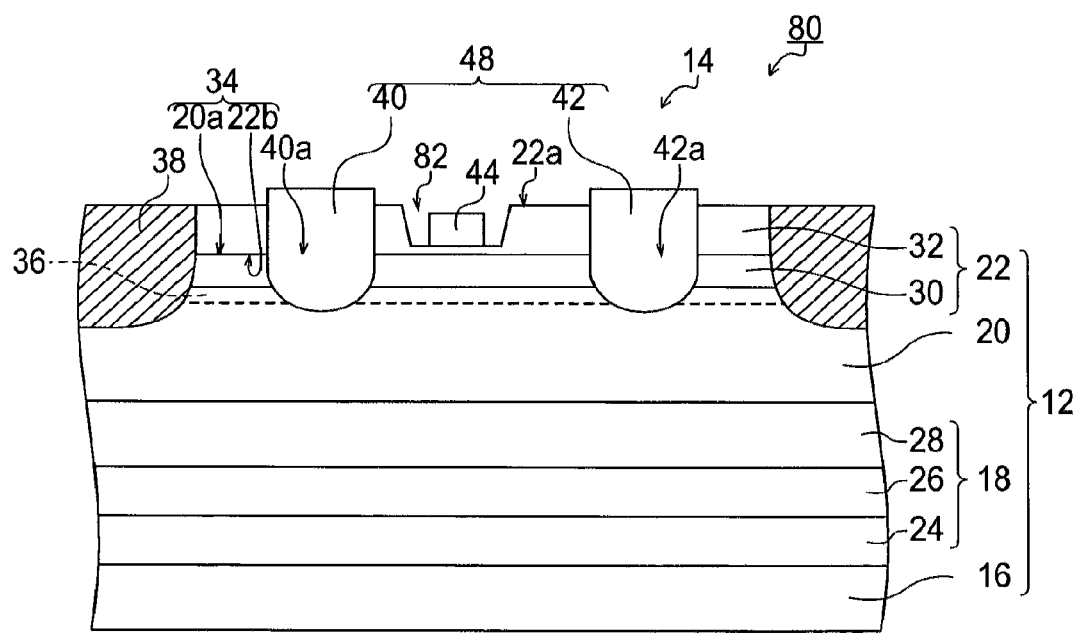
FIG. 19 is a view showing a cross-section of a HEMT of the third embodiment of a semiconductor of the invention.

A third embodiment will be explained referring to FIG. 19 through FIG. 21.

In the third embodiment, the relation between the gas pressure during etching in process (B2) explained in the first embodiment and the shape of the Ohmic electrode 48 will be explained, referring to the electrical characteristics of the HEMT.

In the third embodiment, several types of HEMT were fabricated with the conditions other than the gas pressure during etching (process (B2)) held constant. The gas pressure range was 0.0667 to 26.664 Pa. The depth of the recesses 40a, 42a formed by etching was constant at 67 nm for all HEMT types.

The structure common to the fabricated HEMTs will be explained referring to FIG. 19. For convenience, the HEMT shown in FIG. 19 is called the HEMT 80. Other than providing the gate electrode 44 in a recess 82, the HEMT 80 has a structure similar to that of the HEMT 10 explained in the second embodiment. Hence in FIG. 19, the same symbols are assigned to constituent elements which are the same as in FIG. 13, and explanations will be omitted.

In the HEMT 80, a recess 82 is formed in the region for formation of the gate electrode 44. The gate electrode 44 is provided in this recess 82. As illustrated in FIG. 19, the depth of the recess 82 is smaller than the depth of an interface between the AlN layer 30 and the AlGaN layer 32. The depth of the recess 82 is for example approximately 13 nm.

Next, two representative types of HEMT 80A and 80B are selected from among the several types of HEMT 80 fabricated in this way, and the electrical characteristics and shape of the Ohmic electrodes 48 will be explained.

Figure 20A:
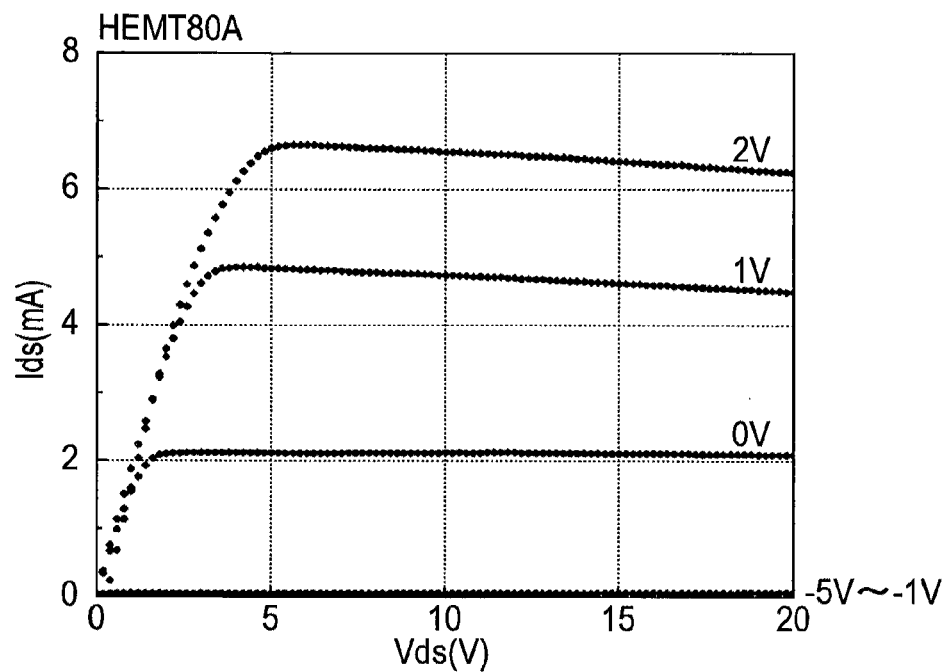
FIG. 20A shows the I-V characteristic of a HEMT of the third embodiment of the invention.
Figure 20B:
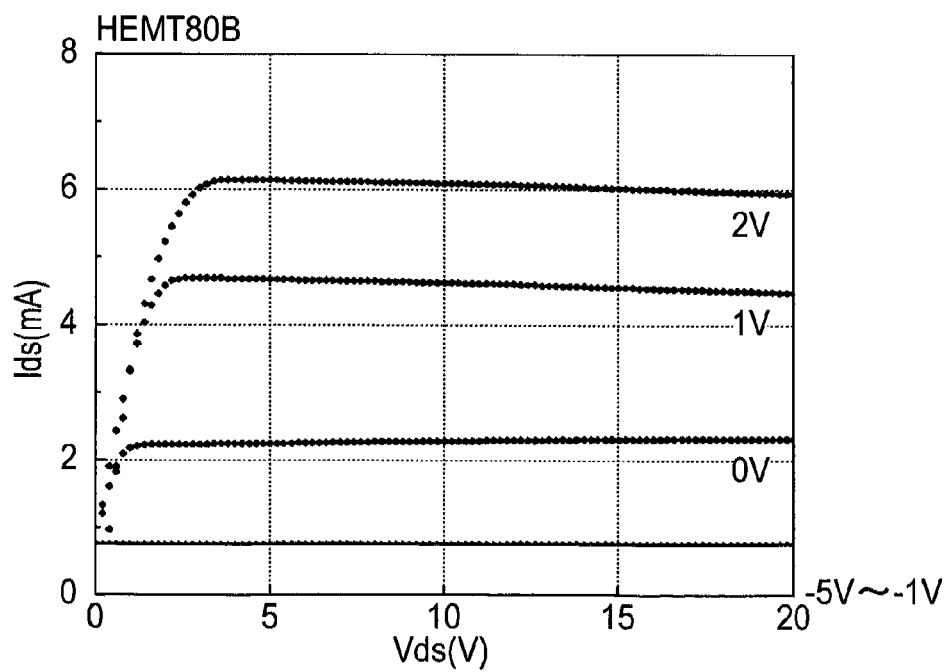
FIG. 20B shows the I-V characteristic of a HEMT of the third embodiment of the invention.

FIG. 20A shows the I-V characteristic of the HEMT 80A, in which the recesses 40a, 42a were formed at a gas pressure of 5.333 Pa. FIG. 20B shows the I-V characteristics of the HEMT 80B, in which the recesses 40a, 42a were formed at a gas pressure of 0.333 Pa.

On comparing FIG. 20A and FIG. 20B, clearly the drain current Ids is larger for the HEMT 80A. The maximum transconductance $Gm_{max}$ calculated from the I-V characteristic is 321 mS/mm for the HEMT 80A, as opposed to 208 mS/mm for the HEMT 80B.

Thus even when the depths of the recesses 40a, 42a are made the same, if the gas pressure during etching is different, differences appear in the electrical characteristics of the HEMTs obtained (HEMTs 80A and 80B).

Next, the relation between the gas pressure during etching and the shape of the Ohmic electrode 48 will be explained, referring to FIG. 3 and FIG. 21.

FIG. 3 is a cross-sectional TEM photo of the Ohmic electrode 62 explained in the first embodiment. However, the Ohmic electrodes 48 of the HEMT 80A and the Ohmic electrode 62 have the same fabrication conditions and electrode depths. Hence it is inferred that the cross-sectional shapes are the same for the Ohmic electrodes 48 in the HEMT 80A and for the Ohmic electrode 62. Hence it is inferred that FIG. 3 shows the cross-sectional shape of Ohmic electrodes 48 in the HEMT 80A.

Figure 21:
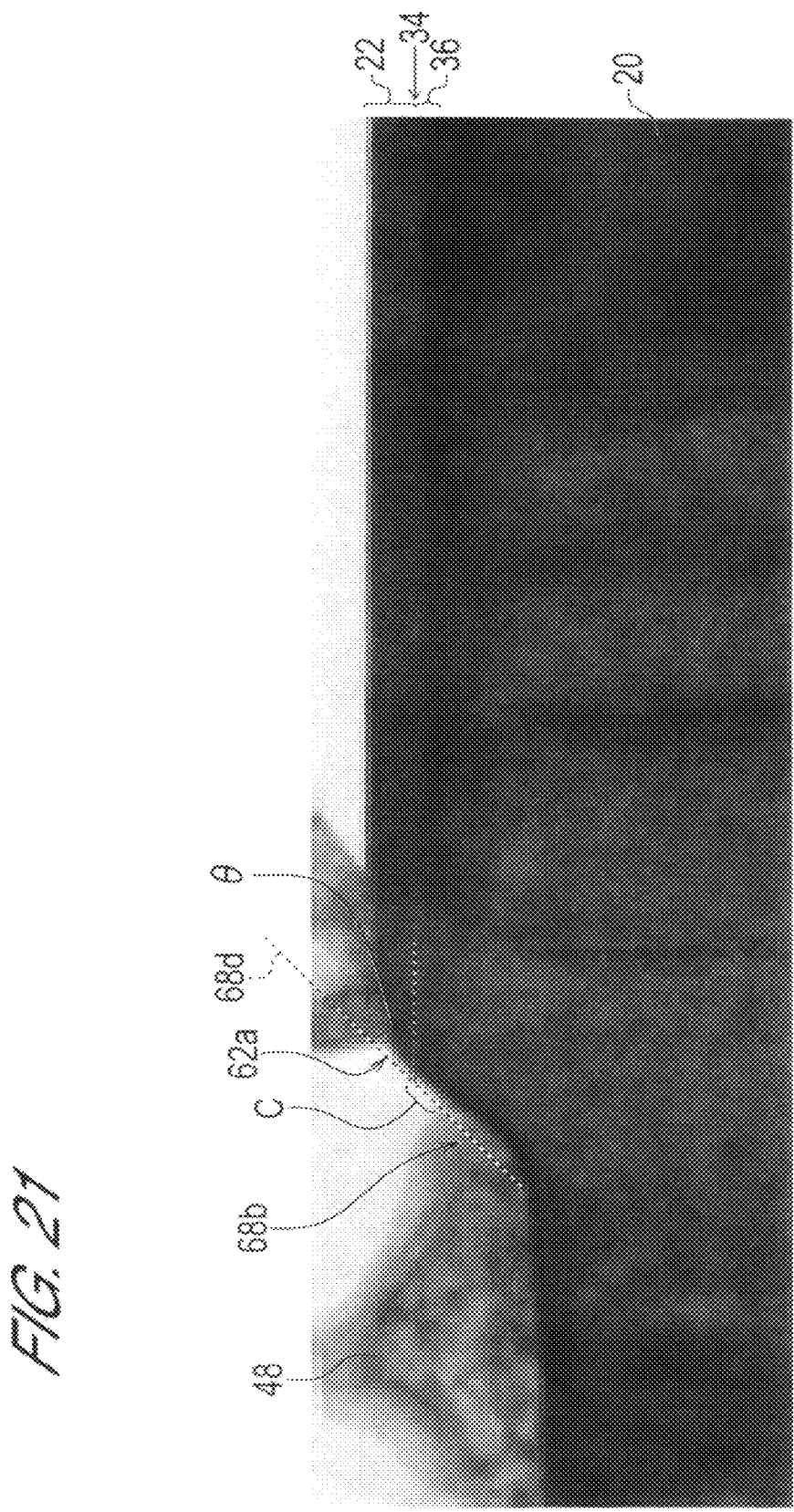
FIG. 21 is a view showing cross-sectional TEM photo of an Ohmic electrode of a HEMT of the third embodiment of the invention.

FIG. 21 is a cross-sectional TEM photo of Ohmic electrodes 48 in the HEMT 80B. The photo was taken at a magnification of 250,000 times.

In FIG. 21, the black portion corresponds to the electron supply layer 22 and electron transit layer 20. The white portion surrounded by the curved black portion corresponds to an Ohmic electrode 48.

The white straight line which horizontally traverses the black portion at a depth of approximately 8 mm from the horizontal plane of the black portion in the photo corresponds to the spacer layer 30.

Comparing FIG. 3 and FIG. 21, while the observation magnifications are different, clearly the slope of the curved surface 68b of the HEMT 80A is more gentle. That is, focusing on the contact area between the curved surface 68b and the two-dimensional electron layer 36, that for the HEMT 80A is larger than that for the HEMT 80B.

Thus it is seen that differences appear in the slope of the curved surface 68b of the resulting HEMT (HEMTs 80A and 80B) when the gas pressures during etching are different.

From the above explanation, it is inferred that the electrical characteristics (source-drain current and maximum transconductance) of a HEMT 80 changes with the magnitude of the contact area between the curved surface 68b and the two-dimensional electron layer 36. Specifically, the larger the contact area between the curved surface 68b and the two-dimensional electron layer 36, the larger are the source-drain current and the maximum transconductance; that is, the electrical characteristics of the HEMT 80 are inferred to be improved.

As an index indicating the magnitude of the contact area between the curved surface 68b and the two-dimensional electron layer 36, the magnitude of the angle θ on the acute-angle side formed by the plane 68d tangent to the curved surface 68b at the depth of the heterointerface 34 and the plane of extension of the heterointerface 34 is considered. The smaller this angle θ, the more gentle is the slope of the curved surface 68b, and the contact area between the curved surface 68b and the two-dimensional electron layer 36 is increased.

As explained in the first embodiment, in the HEMT 80A this angle θ is approximately 33°. Similarly, from FIG. 21, in the HEMT 80B this angle θ is found to be approximately 56°.

Insofar as electrical characteristics which are adequate for practical purposes are obtained from the HEMT 80B also, it is preferable that the angle θ be in the range $0°<θ≦56°$. It is still more preferable that the angle θ be in the range $0°<θ≦33°$.

In terms of the gas pressure during etching, it is preferable that etching be performed at a gas pressure such that the above-described angle θ is in the preferred range $(0°<θ≦56°)$. Specifically, it is preferable that the gas pressure be in the range 0.333 to 5.333 Pa.

Further, although not shown in the drawings, according to evaluations by the inventors, a tendency was observed for the drain current Ids and maximum transconductance $Gm_{max}$ to decrease as the gas pressure rose above 5.333 Pa. However, if the gas pressure is within 13.332 Pa, a drain current Ids and maximum transconductance $Gm_{max}$ which are adequate for practical purposes are obtained.

From these results, it is clear that if the gas pressure is between 0.333 and 13.332 Pa, then a drain current Ids and maximum transconductance $Gm_{max}$ which are adequate for practical purposes can be obtained.

That is, it is inferred that if the gas pressure is between 0.333 and 13.332 Pa, then a contact area between the curved surface 68b and the two-dimensional electron layer 36 can be secured which is adequate for practical purposes. As a result, the contact resistance between the Ohmic electrode 48 and the electron transit layer 20 can be reduced sufficiently for practical purposes, and as a result, the drain current Ids and maximum transconductance $Gm_{max}$ are increased.

It is more preferable that the gas pressure be in the range 0.333 to 7.999 Pa, and more preferable still that the gas pressure be between 0.333 and 5.333 Pa. It is inferred that by setting the gas pressure in these ranges, the slope of the curved surface 68b becomes gentle, and the contact area with the two-dimensional electron layer 36 is increased further. As a result, the contact resistance between the Ohmic electrode 62 and the electron transit layer 20 is reduced by an amount sufficient for practical purposes; and consequently the drain current Ids and maximum transconductance $Gm_{max}$ increase.

What is claimed is:

1. A method of manufacturing an Ohmic electrode structure,
   wherein the Ohmic electrode structure comprises:
   a substrate;
   an electron transit layer formed of a first semiconductor layer formed on a main face of the substrate;
   an electron supply layer, forming a heterojunction with the electron transit layer at a heterointerface, formed on the electron transit layer, the electron supply layer including a second semiconductor layer having electron affinity smaller than that of the first semiconductor layer;
   a two-dimensional electron layer having a two-dimensional electron gas, induced from the heterointerface and extending into the electron transit layer; and
   an Ohmic electrode of a metal material disposed in a recess surrounded by side faces forming sidewalls of depression and a bottom face connecting lower ends of the side faces, said bottom face of said recess being disposed lower than the heterointerface, one end portion of the Ohmic electrode on the main face side penetrating the electron supply layer from a top face of the electron supply layer and being positioned in said electron transit layer, at a depth equal to or greater than the heterointerface, but not exceeding the depth of the electron transit layer, and, at a point where said Ohmic electrode contacts the heterointerface, an angle on an acute-angle side made by a tangential plane of the surface of the Ohmic electrode with a plane of extension of the heterointerface being greater than 0 and less than or equal to 56, and
   wherein the method comprises the steps of:
   forming said recess by etching a region for formation of said Ohmic electrode, from a side of said electron supply layer to a depth equal to or greater than said heterointerface, but to a depth not exceeding said electron transit layer;
   burying said recess with metal material; and
   performing heat treatment of metal material burying said recess.

2. The method of manufacturing said Ohmic electrode structure according to claim 1, wherein, in the step of forming said recess, said etching is performed by inductively-coupled plasma reactive ion etching using $BCl_3$ as an etching gas at a pressure of 0.333 to 13.332 Pa.

3. The method of manufacturing said Ohmic electrode structure according to claim 1, wherein, in the step of forming said recess, said etching is performed by inductively-coupled plasma reactive ion etching using $BCl_3$ as an etching gas at a pressure of 0.333 to 7.999 Pa.

4. The method of manufacturing said Ohmic electrode structure according to claim 1, wherein, in the step of forming said recess, said etching is performed by inductively-coupled plasma reactive ion etching using $BCl_3$ as an etching gas at a pressure of 0.333 to 5.333 Pa.

5. A method of manufacturing a field effect transistor comprising an Ohmic electrode structure,
wherein said Ohmic electrode structure comprises:
a substrate;
an electron transit layer formed of a first semiconductor layer formed on a main face of the substrate;
an electron supply layer, forming a heterojunction with the electron transit layer at a heterointerface, formed on the electron transit layer, the electron supply layer including a second semiconductor layer having electron affinity smaller than that of the first semiconductor layer;
a two-dimensional electron layer having a two-dimensional electron gas, induced from the heterointerface and extending into the electron transit layer; and
an Ohmic electrode of a metal material disposed in a recess surrounded by side faces forming sidewalls of depression and a bottom face connecting lower ends of the side faces, said bottom face of said recess being disposed lower than the heterointerface, one end portion of the Ohmic electrode on the main face side penetrating the electron supply layer from a top face of the electron supply layer and being positioned in said electron transit layer, at a depth equal to or greater than the heterointerface, but not exceeding the depth of the electron transit layer, and, at a point where said Ohmic electrode contacts the heterointerface, an angle on an acute-angle side made by a tangential plane of the surface of the Ohmic electrode with a plane of extension of the heterointerface being greater than 0 and less than or equal to 56,
wherein either one or both of a source electrode and a drain electrode is the Ohmic electrode, and
wherein the method comprises the steps of:
demarcating a region for device formation, by forming a device separation insulating layer which insulates a region on a side on which said Ohmic electrode is to be formed;
forming a recess by performing etching of one or both of a region for forming said source electrode and a region for forming said drain electrode in said region for device formation, from a side of said electron supply layer to a depth equal to or greater than said heterointerface, but to a depth not exceeding said electron transit layer;
burying said recess with metal material; and
performing heat treatment of metal material burying said recess, to form said Ohmic electrode.

6. The method of manufacturing said field effect transistor according to claim 5, wherein, in the step of forming said recess, said etching is performed by inductively-coupled plasma reactive ion etching using $BCl_3$ as an etching gas at a pressure of 0.333 to 13.332 Pa.

7. The method of manufacturing said field effect transistor according to claim 5, wherein, in the step of forming said recess, said etching is performed by inductively-coupled plasma reactive ion etching using $BCl_3$ as an etching gas at a pressure of 0.333 to 7.999 Pa.

8. The method of manufacturing said field effect transistor according to claim 5, wherein, in the step of forming said recess, said etching is performed by inductively-coupled plasma reactive ion etching using $BCl_3$ as an etching gas at a pressure of 0.333 to 5.333 Pa.

* * * * *